United States Patent
Kim et al.

(10) Patent No.: US 10,861,747 B2
(45) Date of Patent: Dec. 8, 2020

(54) SEMICONDUCTOR DEVICE AND METHOD OF FABRICATING THE SAME

(71) Applicant: Samsung Electronics Co., Ltd., Suwon-si (KR)

(72) Inventors: Young-Hun Kim, Seoul (KR); Jaeseok Yang, Hwaseong-si (KR); Haewang Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/439,860

(22) Filed: Jun. 13, 2019

(65) Prior Publication Data

US 2020/0144129 A1     May 7, 2020

(30) Foreign Application Priority Data

Nov. 2, 2018 (KR) ........................ 10-2018-0133668

(51) Int. Cl.
| | |
|---|---|
| *H01L 21/8234* | (2006.01) |
| *H01L 29/66* | (2006.01) |
| *H01L 29/78* | (2006.01) |
| *H01L 21/308* | (2006.01) |
| *H01L 27/088* | (2006.01) |

(52) U.S. Cl.
CPC .. *H01L 21/823468* (2013.01); *H01L 21/3086* (2013.01); *H01L 21/3088* (2013.01); *H01L 21/823431* (2013.01); *H01L 27/0886* (2013.01); *H01L 29/6681* (2013.01); *H01L 29/66553* (2013.01); *H01L 29/785* (2013.01)

(58) Field of Classification Search
CPC ......... H01L 21/823468; H01L 29/6681; H01L 29/785; H01L 21/823431; H01L 29/66553; H01L 21/3088; H01L 21/3086; H01L 27/088; H01L 29/7848; H01L 29/66795; H01L 21/823412
See application file for complete search history.

(56) References Cited

U.S. PATENT DOCUMENTS

| | | |
|---|---|---|
| 8,617,937 B2 | 12/2013 | Cheng et al. |
| 9,209,038 B2 | 12/2015 | Cantone et al. |
| 9,269,589 B2 | 2/2016 | Cheng et al. |
| 9,472,464 B1 | 10/2016 | Zeng et al. |
| 9,472,550 B2 | 10/2016 | Wang et al. |
| 9,627,389 B1 | 4/2017 | Woo et al. |
| 9,673,055 B2 | 6/2017 | Anderson et al. |

(Continued)

*Primary Examiner* — Yasser A Abdelaziez
(74) *Attorney, Agent, or Firm* — Muir Patent Law, PLLC

(57) ABSTRACT

Disclosed are semiconductor devices and methods of fabricating the same. The method comprises sequentially stacking a lower sacrificial layer and an upper sacrificial layer on a substrate, patterning the upper sacrificial layer to form a first upper sacrificial pattern and a second upper sacrificial pattern, forming a first upper spacer and a second upper spacer on sidewalls of the first upper sacrificial pattern and a second upper sacrificial pattern, respectively, using the first and second upper spacers as an etching mask to pattern the lower sacrificial layer to form a plurality of lower sacrificial patterns, forming a plurality of lower spacers on sidewalls of the lower sacrificial patterns, and using the lower spacers as an etching mask to pattern the substrate. The first and second upper spacers are connected to each other.

11 Claims, 35 Drawing Sheets

(56) References Cited

U.S. PATENT DOCUMENTS

| | | |
|---|---|---|
| 9,773,680 B1 | 9/2017 | Zang et al. |
| 2014/0363963 A1* | 12/2014 | Kiyoshi ......... H01L 27/11524 |
| | | 438/593 |
| 2015/0340240 A1* | 11/2015 | Tsai .................... H01L 21/0332 |
| | | 438/696 |
| 2017/0294310 A1* | 10/2017 | Tapily ................. H01L 21/0337 |
| 2019/0035638 A1* | 1/2019 | Fan ..................... H01L 21/0337 |
| 2019/0221439 A1* | 7/2019 | Kim ................ H01L 21/823431 |

\* cited by examiner

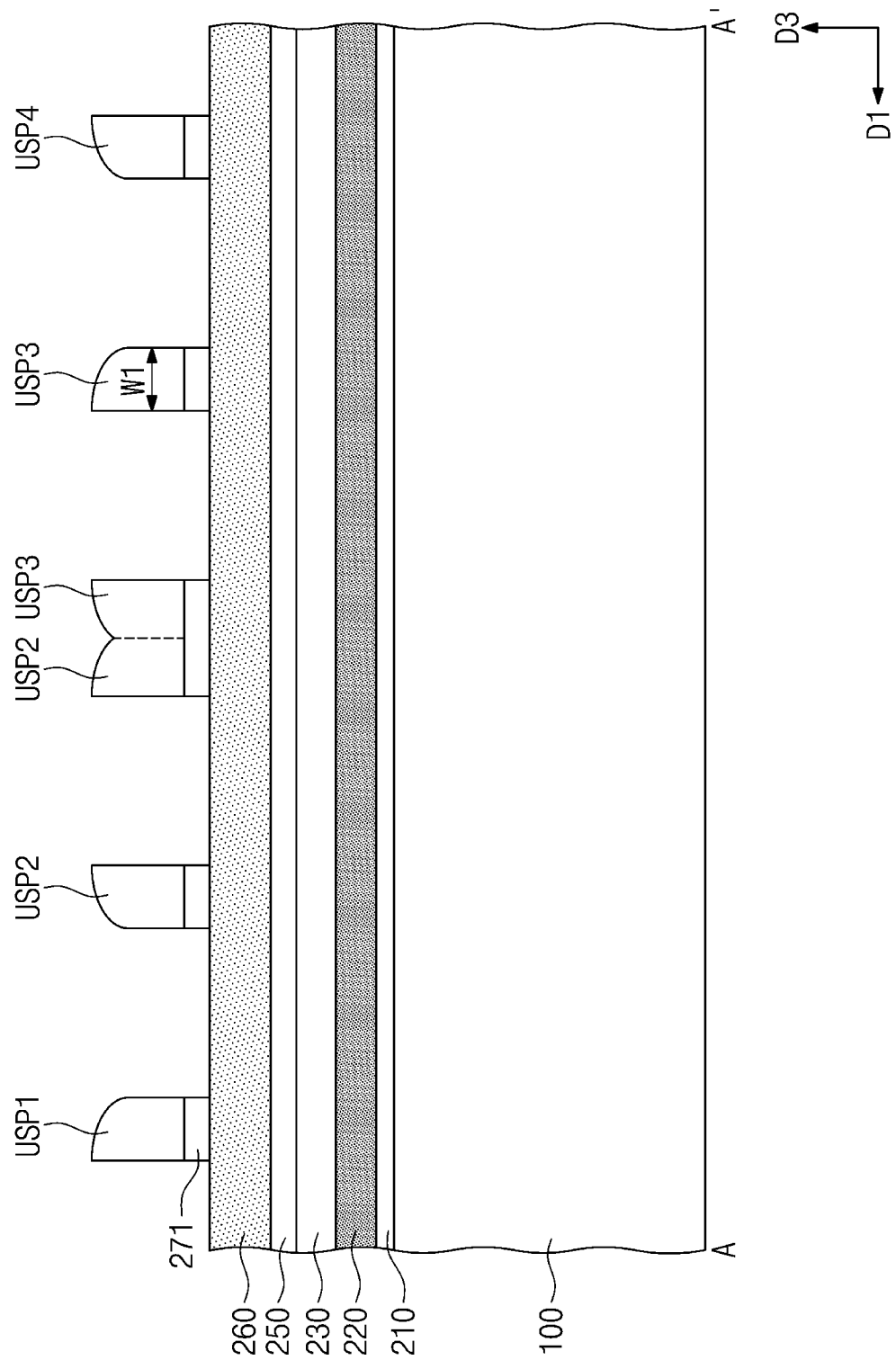

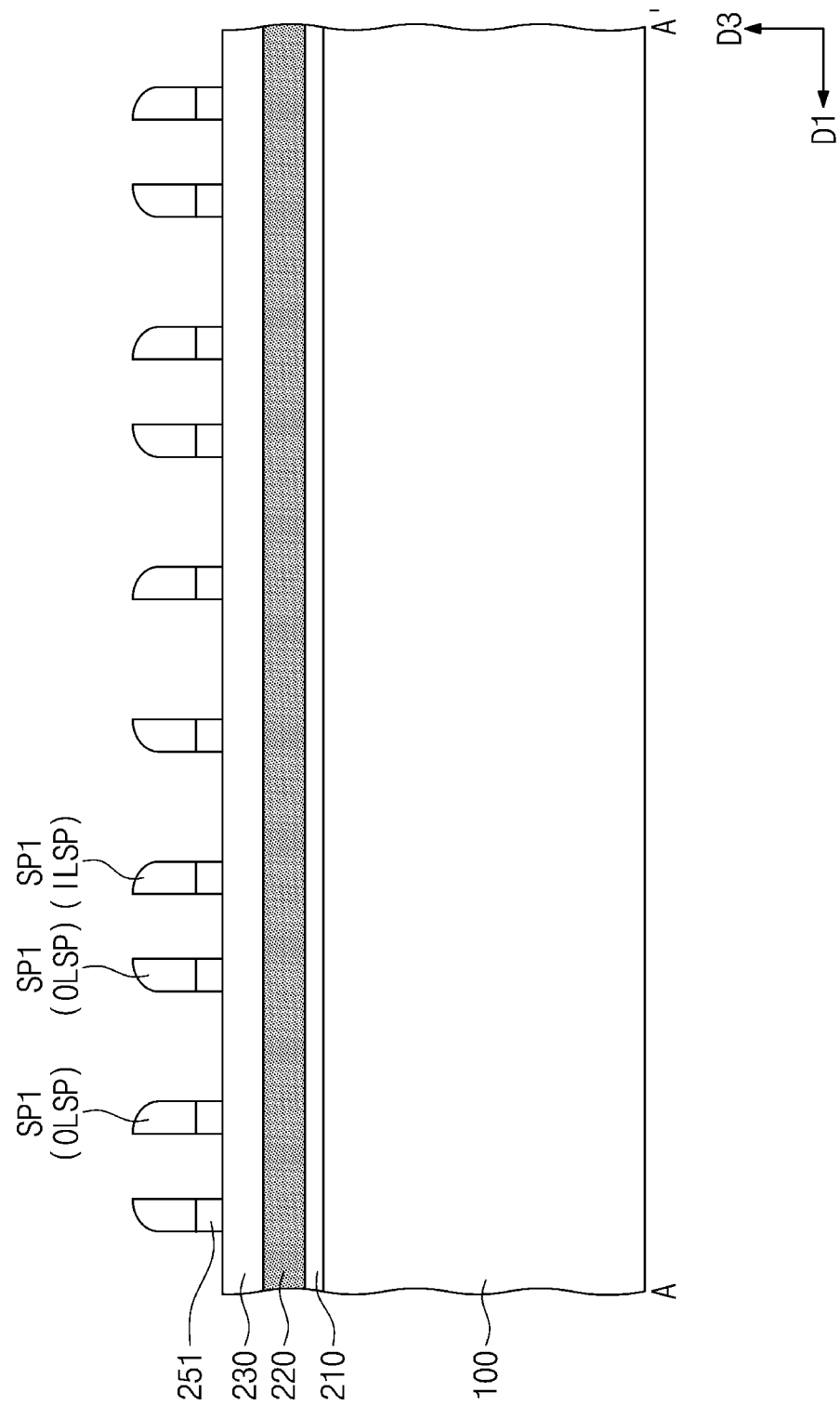

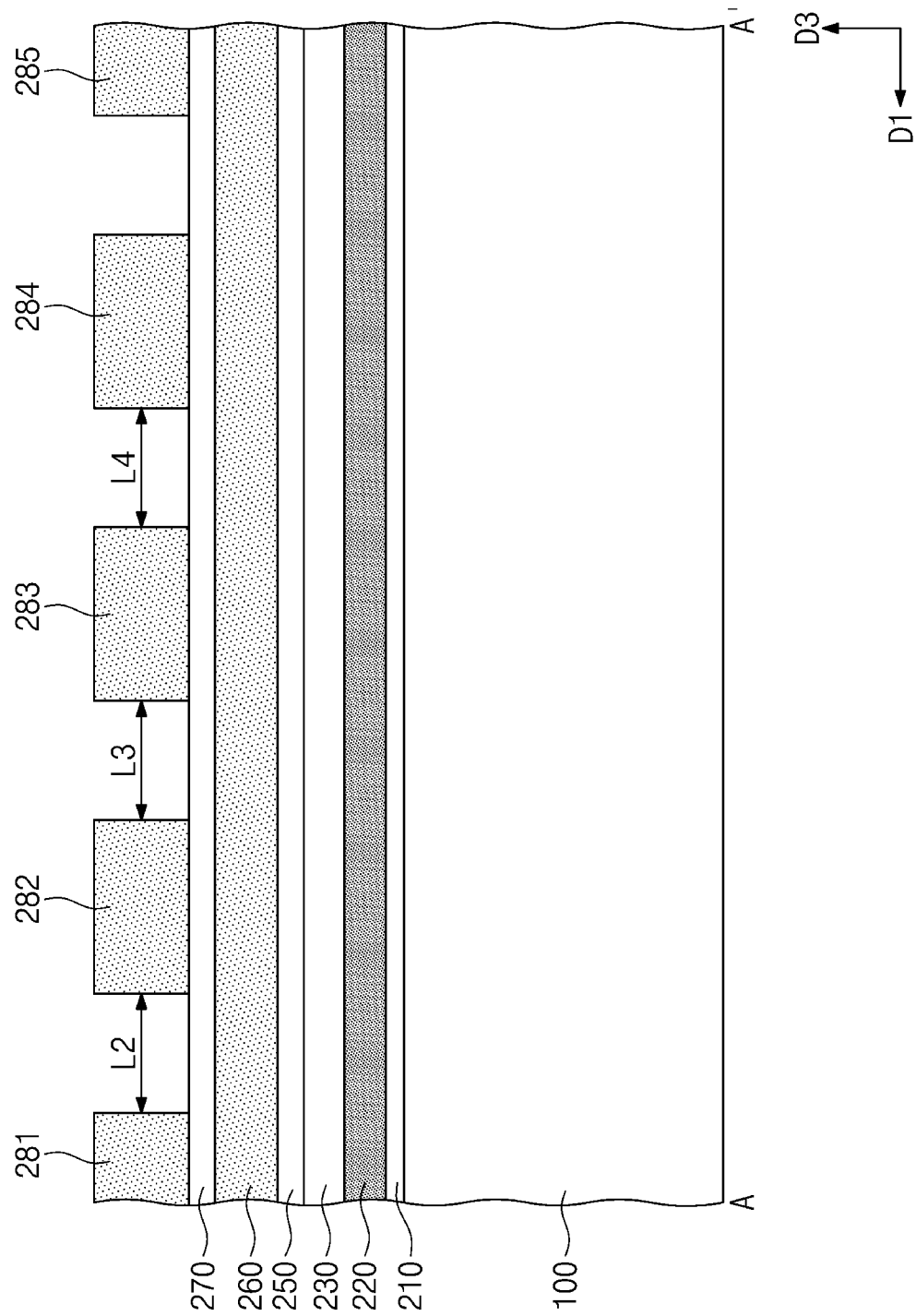

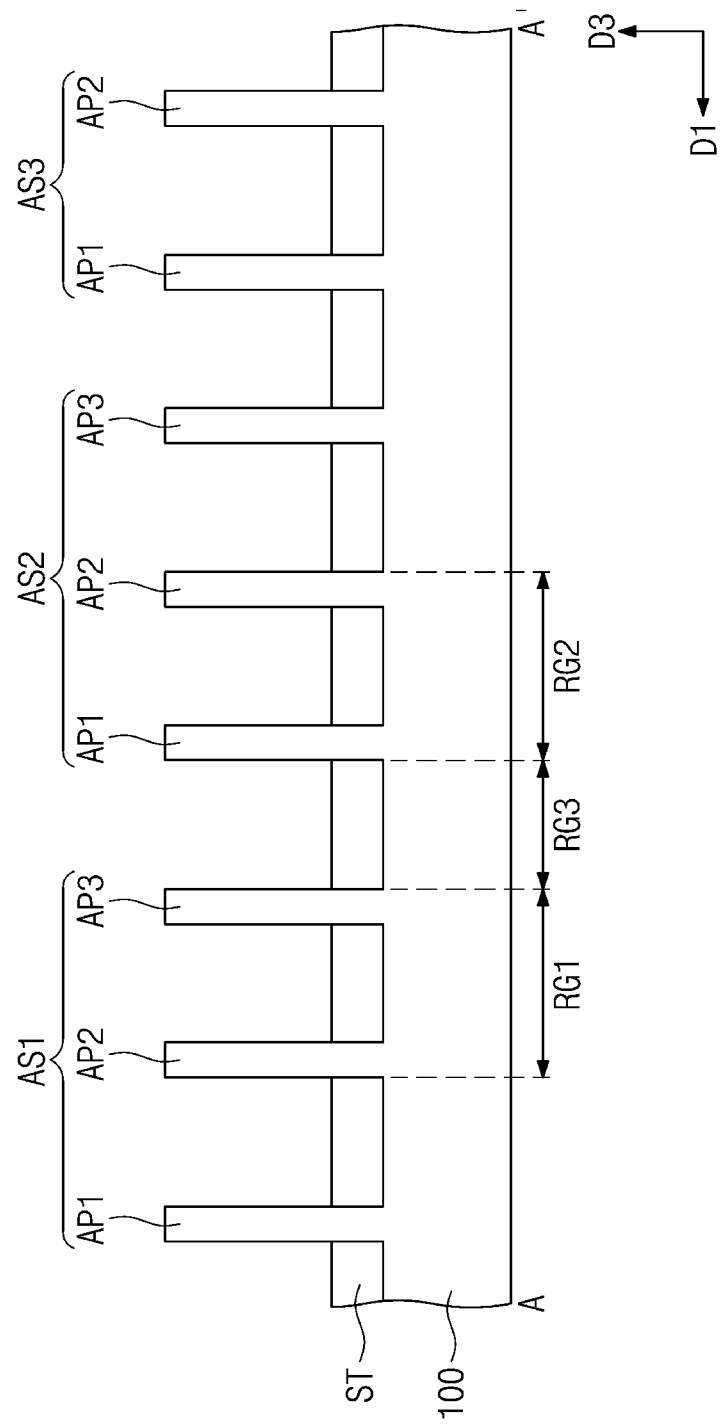

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2018-0133668, filed on Nov. 2, 2018, in the Korean Intellectual Property Office, the entire contents of which are hereby incorporated by reference.

BACKGROUND

The present inventive concepts relate to a semiconductor device and a method of fabricating the same, and more particularly, to a semiconductor device and a method of fabricating the same with reduced fabrication cost and time.

Semiconductor devices have been increasingly required for high integration with the advanced development of electronic industry. For example, semiconductor devices have been increasingly requested for high reliability, high speed, and/or multi-functionality. Semiconductor devices have gradually become more complicated and integrated to meet these requested characteristics.

SUMMARY

Some example embodiments of the present inventive concepts provide a semiconductor device and a method of fabricating the same with reduced fabrication cost and time.

According to example embodiments, the disclosure is directed to a method of fabricating a semiconductor device, the method comprising: sequentially stacking a lower sacrificial layer and an upper sacrificial layer on a substrate; patterning the upper sacrificial layer to form a first upper sacrificial pattern and a second upper sacrificial pattern; forming a first upper spacer and a second upper spacer on sidewalls of the first upper sacrificial pattern and the second upper sacrificial pattern, respectively; patterning the lower sacrificial layer, using the first and second upper spacers as an etching mask, to form a plurality of lower sacrificial patterns; forming a plurality of lower spacers on sidewalls of the lower sacrificial patterns; and patterning the substrate using the plurality of lower spacers as an etching mask, wherein the first and second upper spacers are connected to each other.

According to example embodiments, the disclosure is directed to a method of fabricating a semiconductor device, the method comprising: forming a first upper sacrificial pattern and a second upper sacrificial pattern respectively on a first region and a second region of a substrate; and performing a quadruple patterning technology (QPT) process in which the first and second upper sacrificial patterns are used as mandrels to form a plurality of active patterns on an upper portion of the substrate, wherein the active patterns are not formed on a third region between the first region and the second region.

According to example embodiments, the disclosure is directed to a semiconductor device, comprising: a substrate; first to third active patterns sequentially provided along a first direction on an upper portion of the substrate, wherein the first to third active patterns extend lengthwise in parallel along a second direction; a pair of first inner inactive patterns spaced apart in the second direction from each other across the second and third active patterns; and a pair of first outer inactive patterns spaced apart in the second direction from each other across the first to third active patterns and the pair of first inner inactive patterns.

BRIEF DESCRIPTION OF THE DRAWINGS

FIGS. 2B, 3B, 4B, 5B, 6B, 7B, and 8B illustrate cross-sectional views taken along line A-A' of FIGS. 2A, 3A, 4A, 5A, 6A, 7A, and 8A, respectively.

FIGS. 10B, 11B, 12B, 13B, 14B, 15B, and 16B illustrate cross-sectional views taken along line A-A' of FIGS. 10A, 11A, 12A, 13A, 14A, 15A, and 16A, respectively.

DETAILED DESCRIPTION OF EMBODIMENTS

Figure 1A:
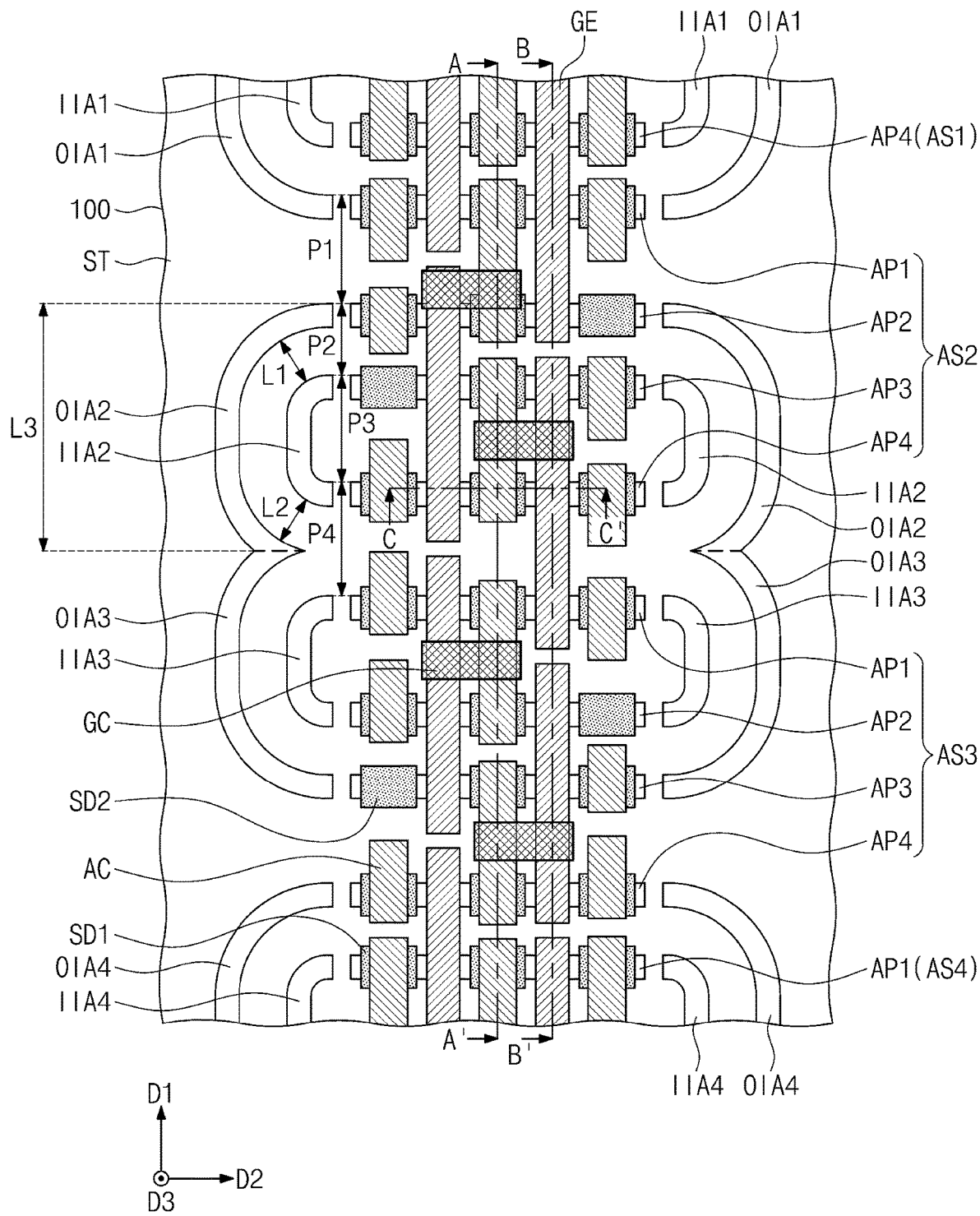
FIG. 1A illustrates a plan view showing a semiconductor device according to some example embodiments of the present inventive concepts.
Figure 1B:
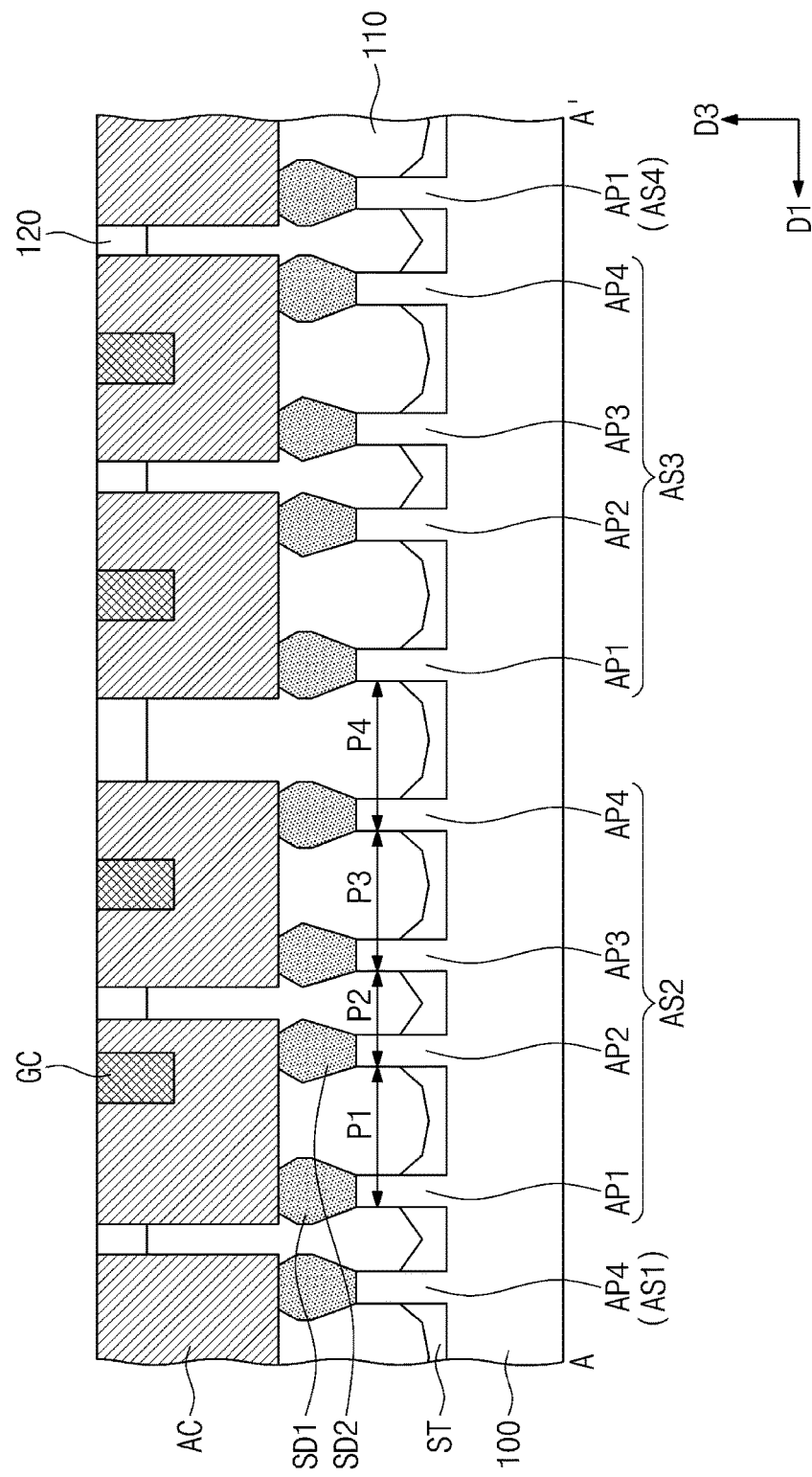
FIG. 1B illustrates a cross-sectional view taken along line A-A' of FIG. 1A.
Figure 1C:
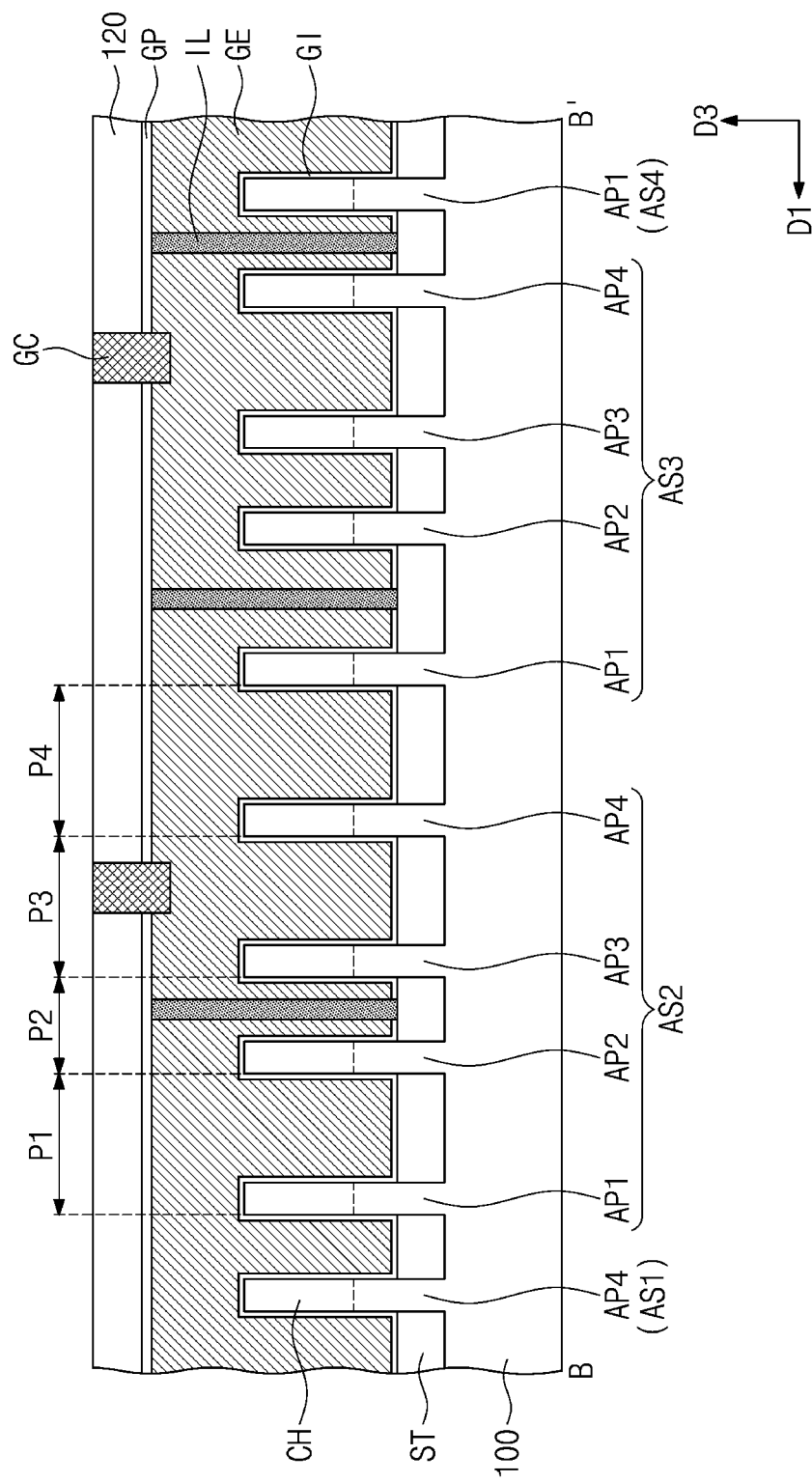
FIG. 1C illustrates a cross-sectional view taken along line B-B' of FIG. 1A.
Figure 1D:
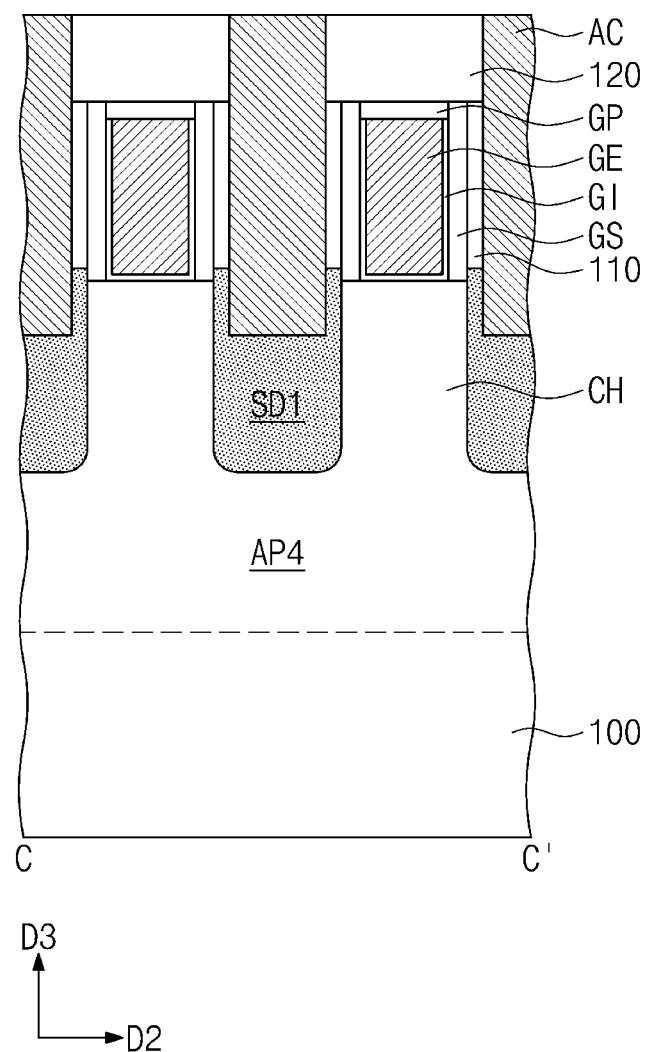
FIG. 1D illustrates a cross-sectional view taken along line C-C' of FIG. 1A.

FIG. 1A illustrates a plan view showing a semiconductor device according to some example embodiments of the present inventive concepts. FIG. 1B illustrates a cross-sectional view taken along line A-A' of FIG. 1A. FIG. 1C illustrates a cross-sectional view taken along line B-B' of FIG. 1A. FIG. 1D illustrates a cross-sectional view taken along line C-C' of FIG. 1A.

Referring to FIGS. 1A, 1B, 1C, and 1D, a substrate 100 may be provided. The substrate 100 may be a semiconductor substrate. For example, the substrate 100 may be a silicon substrate, a germanium substrate, or a silicon-on-insulator (SOI) substrate.

The substrate 100 may be provided thereon with a plurality of memory cells to store data. For example, the substrate 100 may be provided thereon with memory cell transistors included in a plurality of SRAM cells.

A device isolation layer ST may be provided on the substrate 100. The device isolation layer ST may define active structures AS1 to AS4, outer inactive patterns OIA1 to OIA4, and inner inactive patterns IIA1 to IIA4 on an upper portion of the substrate 100.

The active structures AS1 to AS4, the outer inactive patterns OIA1 to OIA4, and the inner inactive patterns IIA1 to IIA4 may have their top portions that vertically protrude higher than the device isolation layer ST. For example, each of the active structures AS1 to AS4, the outer inactive patterns OIA1 to OIA4, and the inner inactive patterns IIA1 to IIA4 may protrude to the same height in the third direction D3, and that same height may be higher than a height of the device isolation layer ST in the third direction D3. Each of the upper portions of the active structures AS1 to AS4, the outer inactive patterns OIA1 to OIA4, and the inner inactive patterns IIA1 to IIA4 may have a fin shape that vertically protrudes from the device isolation layer ST. The device isolation layer ST may include a dielectric material (e.g., a silicon oxide layer).

The active structures AS1 to AS4 may include first to fourth active structures AS1 to AS4. Each of the first to fourth active structures AS1 to AS4 may include first to fourth active patterns AP1 to AP4. Each of the first to fourth active patterns AP1 to AP4 may have a linear or bar shape extending lengthwise in a second direction D2 parallel to a top surface of the substrate 100. An item, layer, or portion of an item or layer described as extending "lengthwise" in a particular direction has a length in the particular direction and a width perpendicular to that direction, where the length is greater than the width. The first to fourth active patterns AP1 to AP4 may be spaced apart from each other in a first direction D1 that is parallel to the top surface of the substrate 100 and intersects the second direction D2.

A first pitch P1 may be provided between the first and second active patterns AP1 and AP2 of the second active structure AS2. A second pitch P2 may be provided between the second and third active patterns AP2 and AP3 of the second active structure AS2. A third pitch P3 may be provided between the third and fourth active patterns AP3 and AP4 of the second active structure AS2. A fourth pitch P4 may be provided between the fourth active pattern AP4 of the second active structure AS2 and the first active pattern AP1 of the third active structure AS3. In some embodiments, pitches of the first to fourth active patterns AP1 to AP4 of the first, third, and fourth active structures AS1, AS3, and AS4 may be the same as the corresponding pitches of the first to fourth active patterns AP1 to AP4 of the second active structure AS2.

The first pitch P1 may be greater than the second pitch P2. The third pitch P3 may be greater than the second pitch P2. The fourth pitch P4 may be greater than the second pitch P2.

The outer inactive patterns OIA1 to OIA4 may be disposed on opposite sides of the active structures AS1 to AS4, and the inner inactive patterns IIA1 to IIA4 may also be disposed on the opposite sides of the active structures AS1 to AS4. For example, pairs of each of the outer inactive patterns OIA1 to OIA4 and the inner inactive patterns IIA1 to IIA4 may be disposed on the opposite sides of the active structures AS1 to AS4 such that they mirror one another. The outer inactive patterns OIA1 to OIA4 and the inner inactive patterns IIA1 to IIA4 may be curved when viewed in plan. The outer inactive patterns OIA1 to OIA4 may include first to fourth outer inactive patterns OIA1 to OIA4. The inner inactive patterns IIA1 to IIA4 may include first to fourth inner inactive patterns IIA1 to IIA4.

Pairs of the inner inactive patterns IIA1 to IIA4 may be spaced apart in the second direction D2 from each other with the active patterns AP1 to AP4 therebetween. For example, a pair of the second inner inactive patterns IIA2 may be spaced apart in the second direction D2 from each other with the third and fourth active patterns AP3 and AP4 of the second active structure AS2 therebetween. As another example, a pair of the second inner inactive patterns IIA3 may be spaced apart in the second direction D2 from each other with the first and second active patterns AP1 and AP2 of the third active structure AS3 therebetween.

A pair of the first outer inactive patterns OIA1 may be spaced apart in the second direction D2 from each other with the first inner inactive pattern IIA1, the fourth active pattern AP4 of the first active structure AS1, and the first active pattern AP1 of the second active structure AS2. A pair of the second outer inactive patterns OIA2 may be spaced apart in the second direction D2 from each other with the second inner inactive pattern IIA2 and the second to fourth active patterns AP2 to AP4 of the second active structure AS2 therebetween. A pair of the third outer inactive patterns OIA3 may be spaced apart in the second direction D2 from each other with the third inner inactive pattern IIA3 and the first to third active patterns AP1 to AP3 of the third active structure AS3 therebetween. A pair of the fourth outer inactive patterns OIA4 may be spaced apart in the second direction D2 from each other across the fourth inner inactive pattern IIA4, the fourth active pattern AP4 of the third active structure AS4, and the first active pattern AP1 of the fourth active structure AS4.

As discussed above, three of the active patterns AP1 to AP4 may be disposed between a pair of the outer inactive patterns OIA1 to OIA4, where the pair faces each other in the second direction D2.

A first length L1 may be provided as a minimum length between a first segment of the second inner inactive pattern IIA2 and the second outer inactive pattern OIA2, which first segment is adjacent to the third active pattern AP3 of the second active structure AS2. A second length L2 may be provided as a minimum length between a second segment of the second inner inactive pattern IIA2 and the second outer inactive pattern OIA2, where the second segment is adjacent to the fourth active pattern AP4 of the second active structure AS2. The first length L1 and the second length L2 may be substantially the same. In some embodiments, the length (or distance) between an outer surface of a given inner inactive pattern IIA1 to IIA4 and an inner surface of a corresponding outer inactive pattern OIA1 to OIA4 may be uniform.

The first and second outer inactive patterns OIA1 and OIA2 may be spaced apart from each other in the first direction D1. The third and fourth outer inactive patterns OIA3 and OIA4 may be spaced apart from each other in the first direction D1. The second and third outer inactive patterns OIA2 and OIA3 may be connected to each other. For example, the second and third outer inactive patterns OIA2 and OIA3 may be combined into a single body (e.g., a monolithic structure).

The second outer inactive pattern OIA2 may have a third length L3 corresponding to a maximum length of the second outer inactive pattern OIA2 in the first direction D1 thereof. The third length L3 may be greater than a sum of the second pitch P2 and the third pitch P3. The third length L3 may be less than a sum of the second pitch P2, the third pitch P3, and the fourth pitch P4.

First source/drain patterns SD1 may be provided on each of the first and fourth active patterns AP1 and AP4. Second source/drain patterns SD2 may be provided on each of the second and third active patterns AP2 and AP3. The first source/drain patterns SD1 may be n-type impurity regions. The second source/drain patterns SD2 may be p-type impurity regions.

The first source/drain patterns SD1 may define a channel CH on an upper portion of each of the first and fourth active patterns AP1 and AP4, and the second source/drain patterns SD2 may define a channel CH on an upper portion of each of the second and third active patterns AP2 and AP3. Each of the channels CH may be interposed between neighboring first source/drain patterns SD1 or between neighboring second source/drain patterns SD2. For example, each of the channels CH may connect neighboring first source/drain patterns SD1 to each other or may connect neighboring second source/drain patterns SD2 to each other.

Each of the first source/drain patterns SD1 may be an epitaxial pattern formed either from the channel CH and the first active pattern AP1 that serve as a seed layer or from the channel CH and the fourth active pattern AP4 that serve as a seed layer. For example, the first source/drain patterns SD1 may be a semiconductor element whose lattice constant is less than that of a semiconductor element of the substrate 100. For another example, the first source/drain patterns SD1 may be the same semiconductor element (e.g., silicon) as that of the substrate 100.

Each of the second source/drain patterns SD2 may be an epitaxial pattern formed either from the channel CH and the second active pattern AP2 that serve as a seed layer or from the channel CH and the third active pattern AP3 that serve as a seed layer. The second source/drain patterns SD2 may include a material that provides a compressive strain to the channel CH therebetween. For example, the second source/drain patterns SD2 may be a semiconductor element (e.g., silicon-germanium) whose lattice constant is greater than that of a semiconductor element of the substrate 100.

The substrate 100 may be provided thereon with gate electrodes GE running across the channels CH and extending lengthwise in the first direction D1. The gate electrodes GE may be spaced apart from each other in the second direction D2. The gate electrodes GE may vertically overlap the channels CH. The gate electrodes GE may include, for example, one or more of a conductive metal nitride (e.g., titanium nitride or tantalum nitride) and a metal (e.g., titanium, tantalum, tungsten, copper, or aluminum).

A dielectric pattern IL may be provided on the substrate 100. The dielectric pattern IL may be interposed between the gate electrodes GE. The dielectric pattern IL may separate the gate electrodes GE from each other, electrically isolating each gate electrode GE.

A pair of gate spacers GS may be disposed on opposite sidewalls of each of the gate electrodes GE. The gate spacers GS may extend lengthwise in the first direction D1 along the gate electrodes GE. The gate spacers GS may have their top surfaces higher than top surfaces of the gate electrodes GE. The top surfaces of the gate spacers GS may be coplanar with that of a first interlayer dielectric layer 110 which will be discussed below. For example, the gate spacers GS may include one or more of $SiO_2$, SiCN, SiCON, and SiN. For another example, the gate spacers GS may include a multi-layer that consists of two or more of $SiO_2$, SiCN, SiCON, and SiN.

Gate dielectric patterns GI may be interposed between corresponding gate electrodes GE and corresponding channels CH. The gate dielectric patterns GI may also be interposed between the gate electrodes GE and the gate spacers GS that extend along the gate electrodes GE. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the gate electrodes GE. The gate capping patterns GP may extend lengthwise in the first direction D1 along the gate electrodes GE. For example, the gate capping patterns GP may extend along top surfaces of the gate electrodes GE and between neighboring gate spacers GS. The gate capping patterns GP may include a material having an etch selectivity with respect to first and second interlayer dielectric layers 110 and 120, which will be discussed below. For example, the gate capping patterns GP may include one or more of SiON, SiCN, SiCON, and SiN.

A first interlayer dielectric layer 110 may be provided on an entire surface of the substrate 100. The first interlayer dielectric layer 110 may cover the device isolation layer ST, the gate electrodes GE, and the first and second source/drain patterns SD1 and SD2. The first interlayer dielectric layer 110 may have a top surface substantially coplanar with those of the gate capping patterns GP. A second interlayer dielectric layer 120 may be provided on the first interlayer dielectric layer 110. The first and second interlayer dielectric layers 110 and 120 may include, for example, a silicon oxide layer or a silicon oxynitride layer.

Active contacts AC may be provided to penetrate the first and second interlayer dielectric layers 110 and 120 and to have connection with the first and second source/drain patterns SD1 and SD2. The active contacts AC may have their top surfaces coplanar with that of the second interlayer dielectric layer 120. The active contacts AC may include a metallic material (e.g., titanium, tantalum, tungsten, copper, or aluminum).

Gate contacts GC may be provided on the gate electrodes GE. Each of the gate contacts GC may penetrate the second interlayer dielectric layer 120 and the gate capping pattern GP and may have connection with the gate electrode GE. The gate contacts GC may have their top surfaces coplanar with that of the second interlayer dielectric layer 120. The gate contacts GC may have their bottom surfaces higher than those of the active contacts AC.

The gate contacts GC may include one or more of conductive metal nitride (e.g., titanium nitride or tantalum nitride) and metal (e.g., titanium, tantalum, tungsten, copper, or aluminum). The gate contacts GC may include the same material as that of the active contacts AC. The gate contact GC and its connected active contact AC may form a single conductive structure.

FIGS. 2A, 3A, 4A, 5A, 6A, 7A, and 8A illustrate plan views showing a method of fabricating a semiconductor device depicted in FIGS. 1A, 1B, 1C, and 1D. FIGS. 2B, 3B, 4B, 5B, 6B, 7B, and 8B illustrate cross-sectional views taken along line A-A' of FIGS. 2A, 3A, 4A, 5A, 6A, 7A, and 8A, respectively.

Figure 2A:
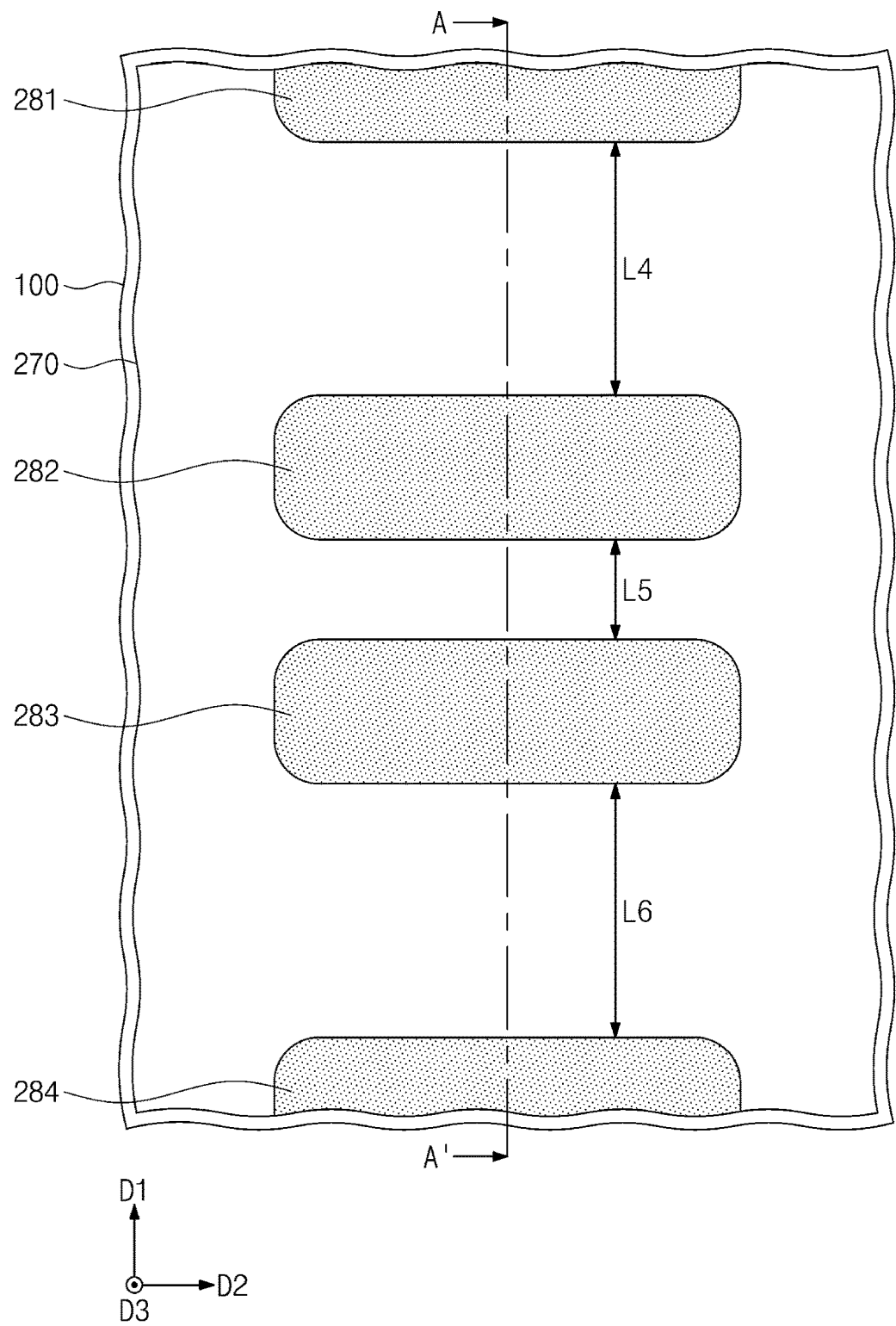
FIGS. 2A, 3A, 4A, 5A, 6A, 7A, and 8A illustrate plan views showing a method of fabricating a semiconductor device depicted in FIGS. 1A, 1B, 1C, and 1D.
Figure 2B:
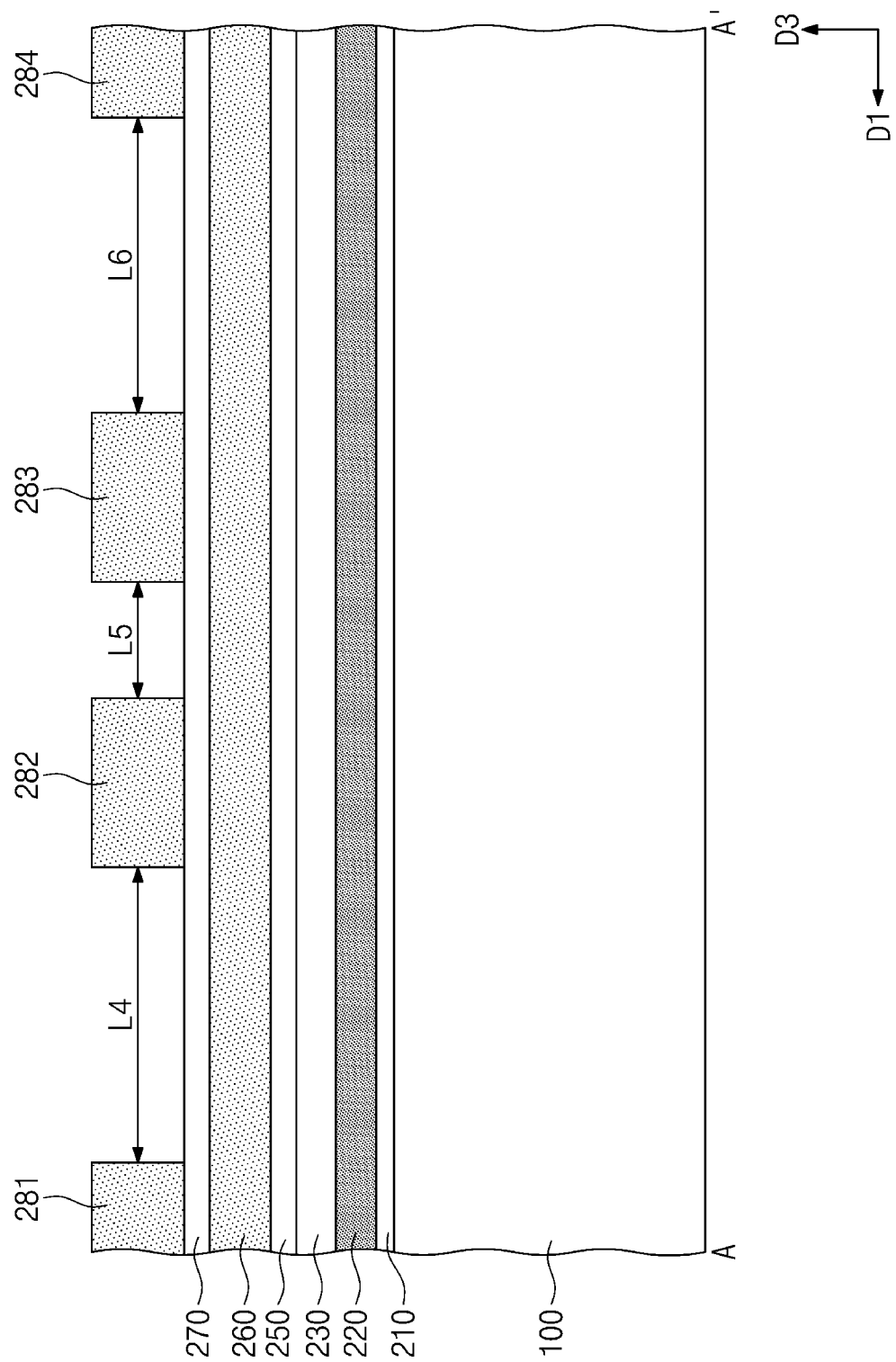

Referring to FIGS. 2A and 2B, a substrate 100 may be sequentially provided thereon with a first mask layer 210, a second mask layer 220, a third mask layer 230, a fourth mask layer 250, a lower sacrificial layer 260, a fifth mask layer 270, and an upper sacrificial layer (not shown).

Each of the first to fifth mask layers 210, 220, 230, 250, and 270, the lower sacrificial layer 260, and the upper sacrificial layer may include one or more of silicon oxide ($SiO_2$), silicon oxynitride (SiON), silicon nitride ($Si_3N_4$), tetraethylorthosilicate (TEOS), polycrystalline silicon, an amorphous carbon layer (ACL), and a spin-on-hardmask (SOH) layer. For example, the first mask layer 210 may include silicon oxide ($SiO_2$), the second mask layer 220 may include silicon nitride ($Si_3N_4$), the third mask layer 230 may include silicon oxide (SiO2), the fourth mask layer 250 may include polycrystalline silicon, the fifth mask layer 270 may include polycrystalline silicon, the lower sacrificial layer 260 may include an amorphous carbon layer (ACL), and the upper sacrificial layer may include an amorphous carbon layer (ACL).

Each of the first to fifth mask layers 210, 220, 230, 250, and 270, the lower sacrificial layer 260, and the upper sacrificial layer may be formed by an atomic layer deposition (ALD) process, a chemical vapor deposition (CVD)

process, or a spin coating process; a baking or curing process may be additionally performed depending their material.

The upper sacrificial layer may be patterned to form upper sacrificial patterns 281 to 284. The upper sacrificial patterns 281 to 284 may be formed by a photolithography process. The upper sacrificial patterns 281 to 284 may include first to fourth upper sacrificial patterns 281 to 284. Four upper sacrificial patterns 281 to 284 are illustrated, but the number of the upper sacrificial patterns 281 to 284 may not be limited to four.

The first to fourth upper sacrificial patterns 281 to 284 may be arranged along a first direction D1. For example, the first to fourth upper sacrificial patterns may be aligned along the first direction D1. The first to fourth upper sacrificial patterns 281 to 284 may be spaced apart from each other along the first direction D1. A fourth length L4 may be provided as a minimum length in the first direction D1 between the first and second upper sacrificial patterns 281 and 282. A fifth length L5 may be provided as a minimum length in the first direction D1 between the second and third upper sacrificial patterns 282 and 283. A sixth length L6 may be provided as a minimum length in the first direction D1 between the third and fourth upper sacrificial patterns 283 and 284. The fourth length L4 and the sixth length L6 may be substantially the same. The fifth length L5 may be less than each of the fourth length L4 and the sixth length L6.

Figure 3A:
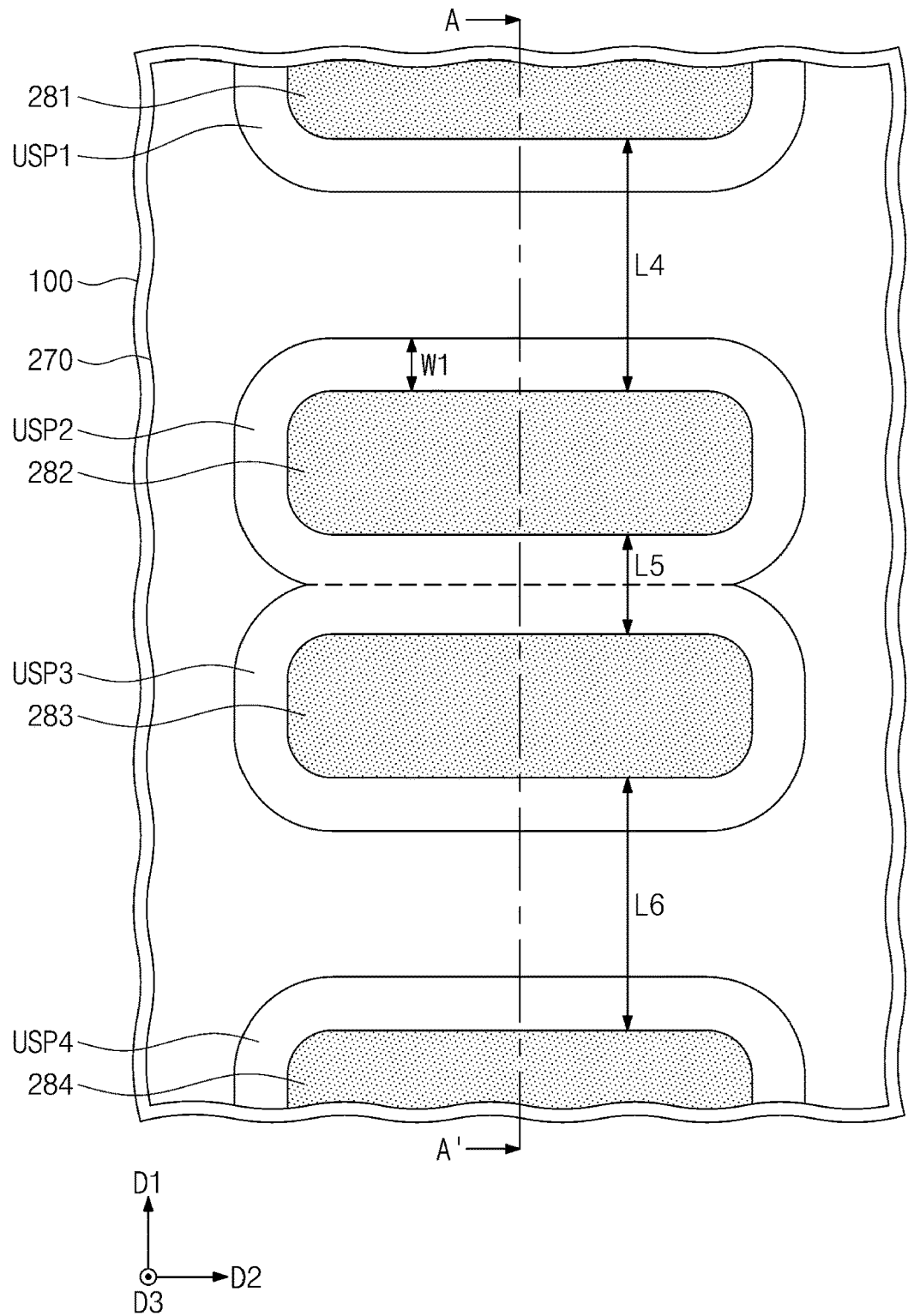
Figure 3B:
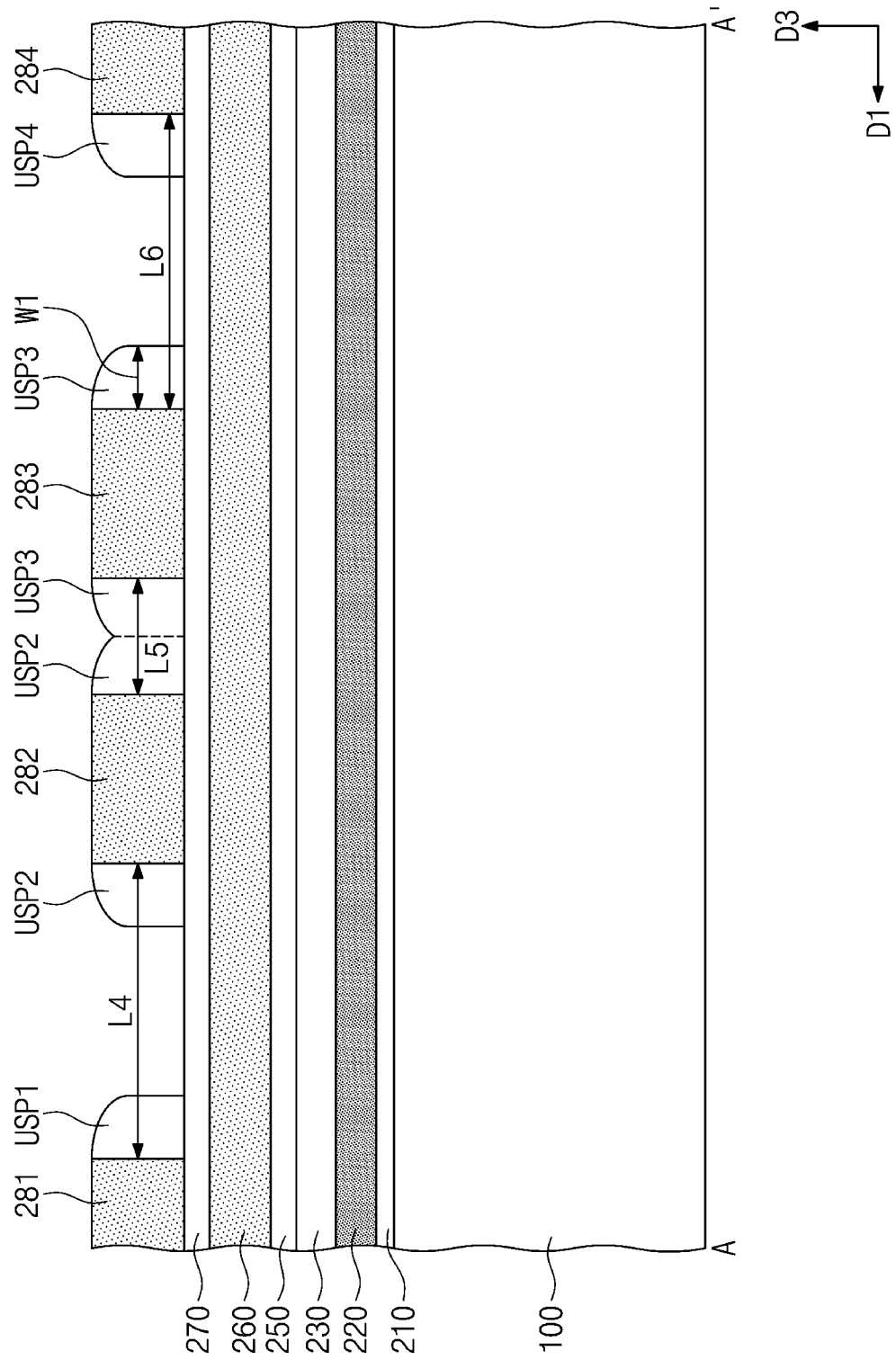

Referring to FIGS. 3A and 3B, first to fourth upper spacers USP1 to USP4 may be formed on sidewalls of the first to fourth upper sacrificial patterns 281 to 284. The formation of the first to fourth upper spacers USP1 to USP4 may include conformally forming an upper spacer layer on an entire surface of the substrate 100 and performing an etch-back process. The upper spacer layer may include a material having an etch selectivity with respect to the first to fourth upper sacrificial patterns 281 to 284. For example, the upper spacer layer may include silicon oxide or silicon nitride. The upper spacer layer may be conformally formed by an atomic layer deposition (ALD) process.

The first upper spacer USP1 may be formed on the sidewall of the first upper sacrificial pattern 281, the second upper spacer USP2 may be formed on the sidewall of the second upper sacrificial pattern 282, the third upper spacer USP3 may be formed on the sidewall of the third upper sacrificial pattern 283, and the fourth upper spacer USP4 may be formed on the sidewall of the fourth upper sacrificial pattern 284.

The first and second upper spacers USP1 and USP2 may be spaced apart from each other in the first direction D1. The third and fourth upper spacers USP3 and USP4 may be spaced apart from each other in the first direction D1. The second and third upper spacers USP2 and USP3 may be connected to each other between the second and third upper sacrificial patterns 282 and 283. For example, the second and third upper spacers USP2 and USP3 may be combined into a single body.

The first to fourth upper spacers USP1 to USP4 may have the same maximum width. Each of the first to fourth upper spacers USP1 to USP4 may have a first width W1 corresponding to the maximum width thereof. The widths of the first to fourth upper spacers USP1 to USP4 may correspond to the distance between inner and outer surfaces of the first to fourth upper spacers USP1 to USP4. Twice the first width W1 may be less than each of the fourth length L4 and the sixth length L6. Twice the first width W1 may be greater than or substantially the same as the fifth length L5. For example, twice the first width W1 may be greater than or substantially the same as the minimum length in the first direction D1 between the second upper sacrificial pattern 282 and the third upper sacrificial pattern 283.

Figure 4A:
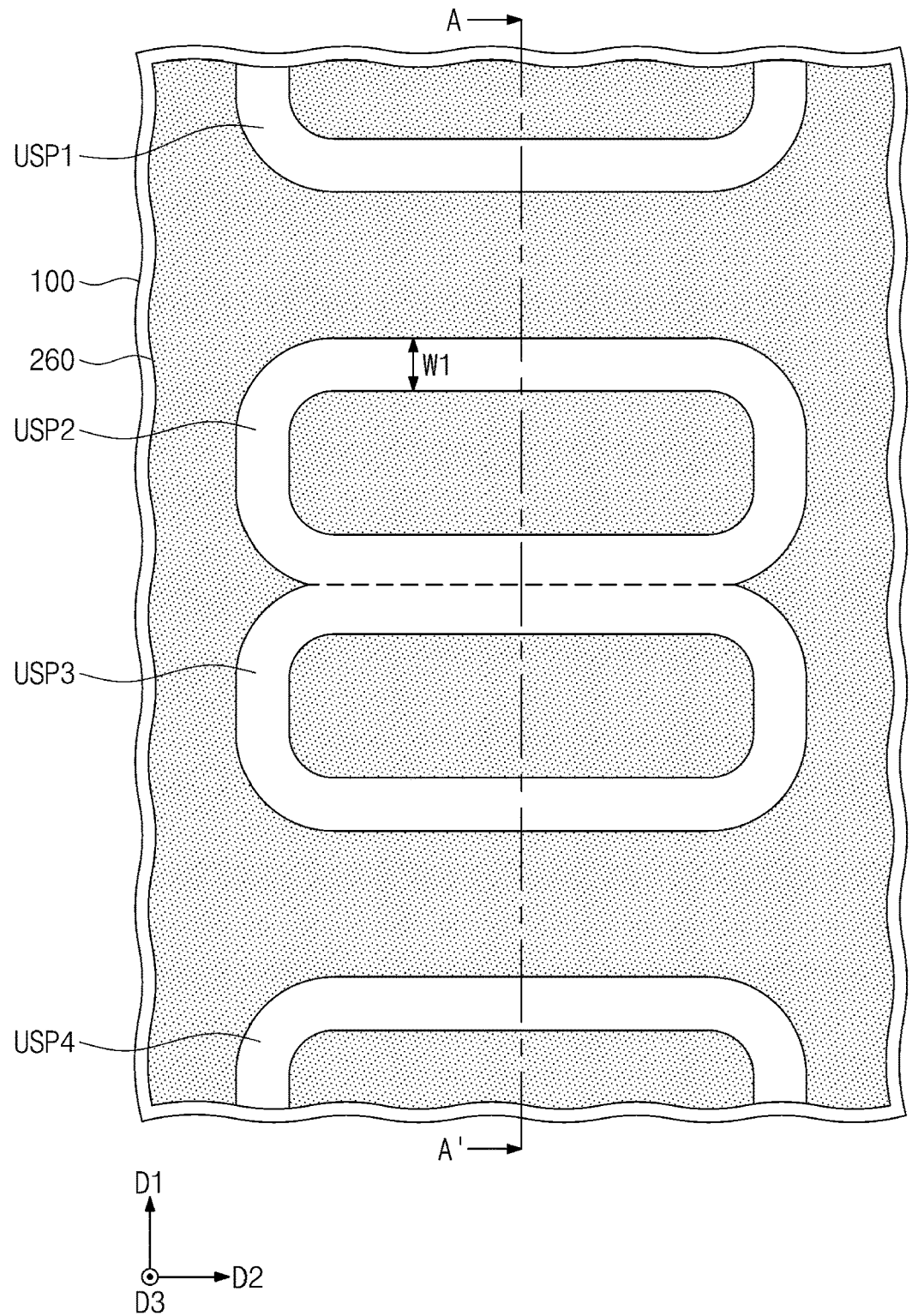

Referring to FIGS. 4A and 4B, the first to fourth upper sacrificial patterns 281 to 284 may be removed. Because the first to fourth upper sacrificial patterns 281 to 284 have an etch selectivity with respect to the first to fourth upper spacers USP1 to USP4, the first to fourth upper sacrificial patterns 281 to 284 may be selectively removed under a specific etching condition.

The first to fourth upper spacers USP1 to USP4 may be used as an etching mask to pattern the fifth mask layer 270. The fifth mask layer 270 may be patterned to form fifth mask patterns 271.

Figure 5A:
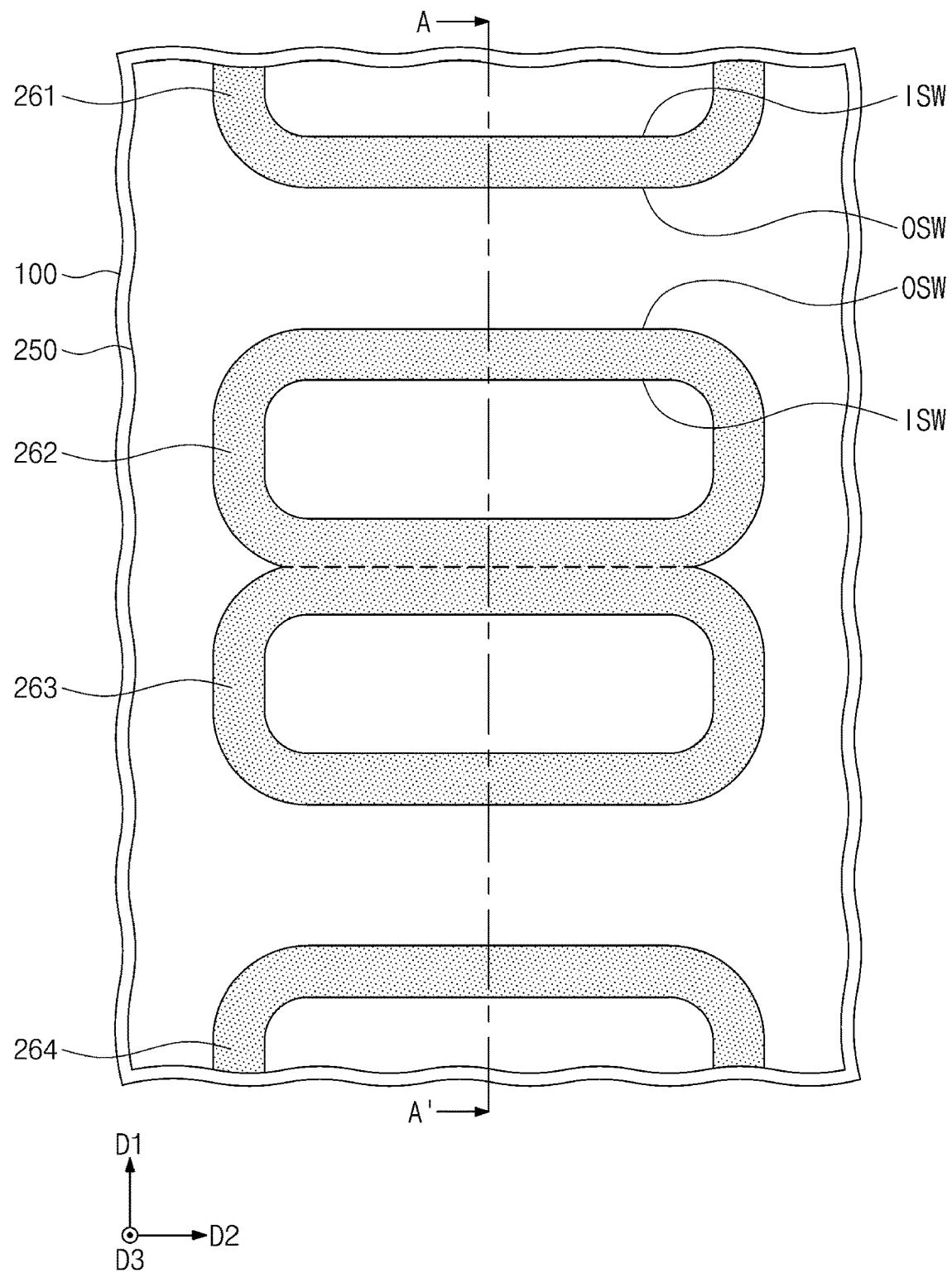
Figure 5B:
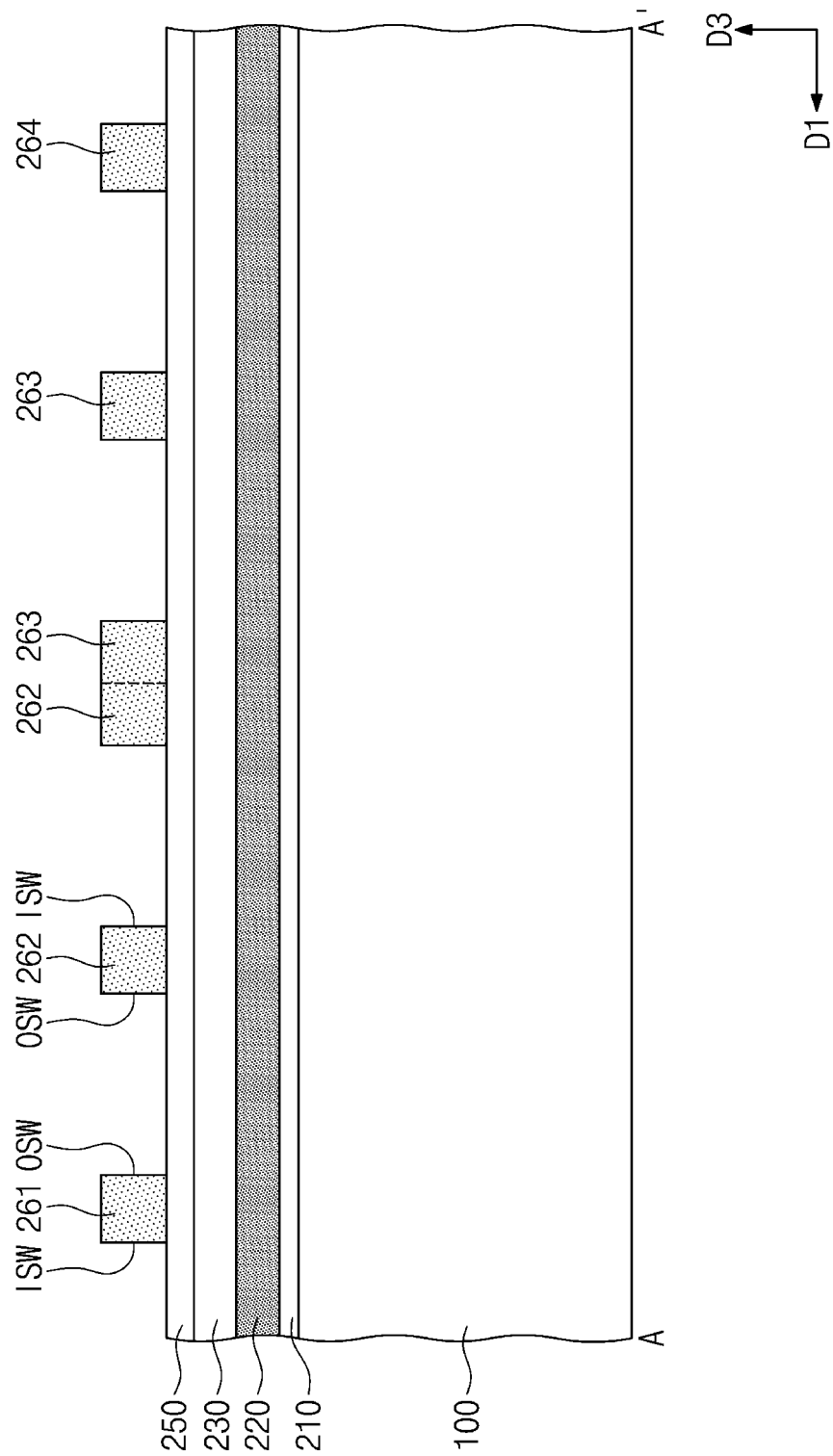

Referring to FIGS. 5A and 5B, the first to fourth upper spacers USP1 to USP4 and the fifth mask patterns 271 may be used as an etching mask to pattern the lower sacrificial layer 260. The lower sacrificial layer 260 may be patterned to form first to fourth lower sacrificial patterns 261 to 264.

The first to fourth lower sacrificial patterns 261 to 264 may vertically overlap the first to fourth upper spacers USP1 to USP4. For example, the first to fourth lower sacrificial patterns 261 to 264 may have a planar shape substantially the same as that of the first to fourth upper spacers USP1 to USP4.

Each of the first to fourth lower sacrificial patterns 261 to 264 may include an inner sidewall ISW and an outer sidewall OSW.

Figure 6A:
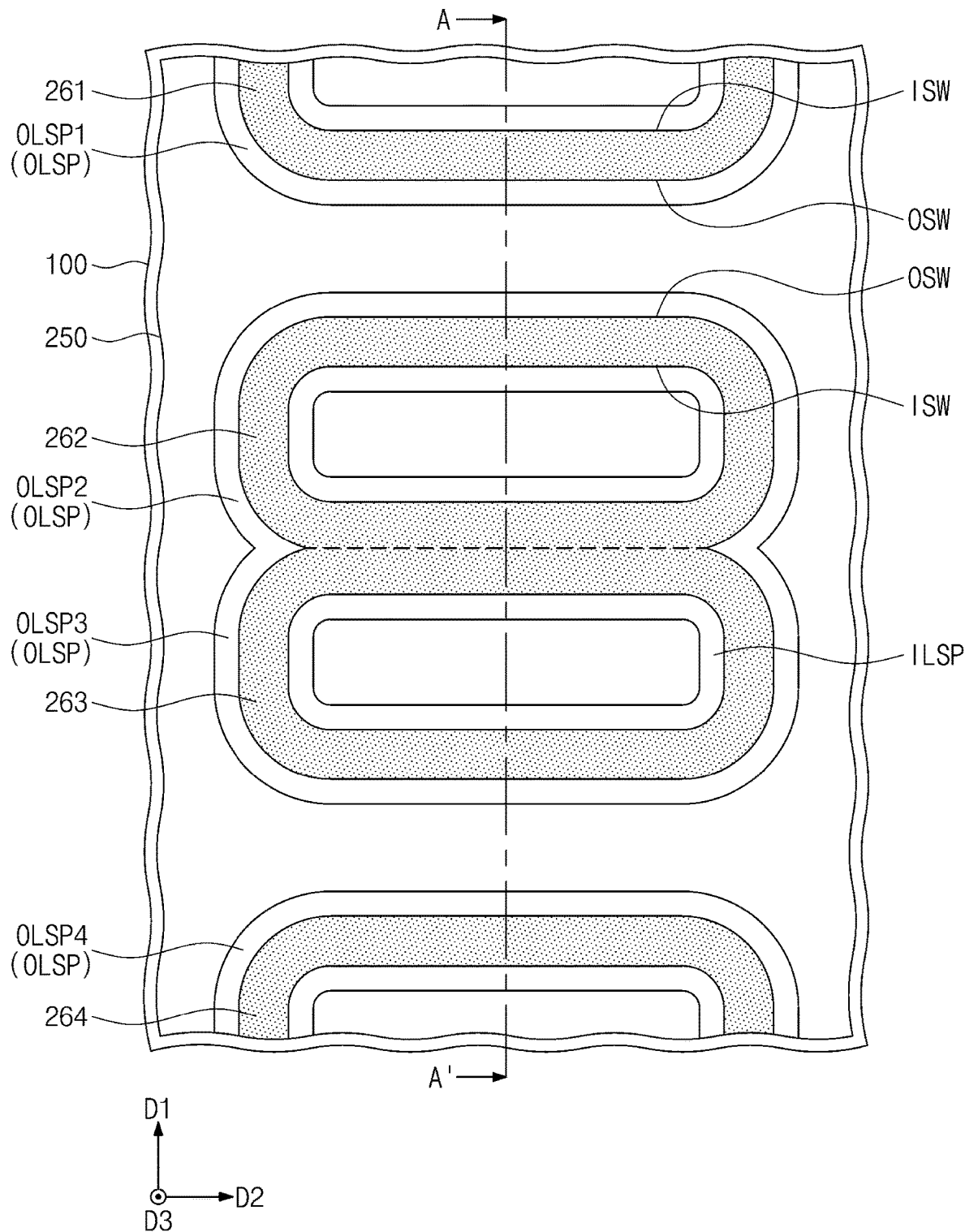
Figure 6B:
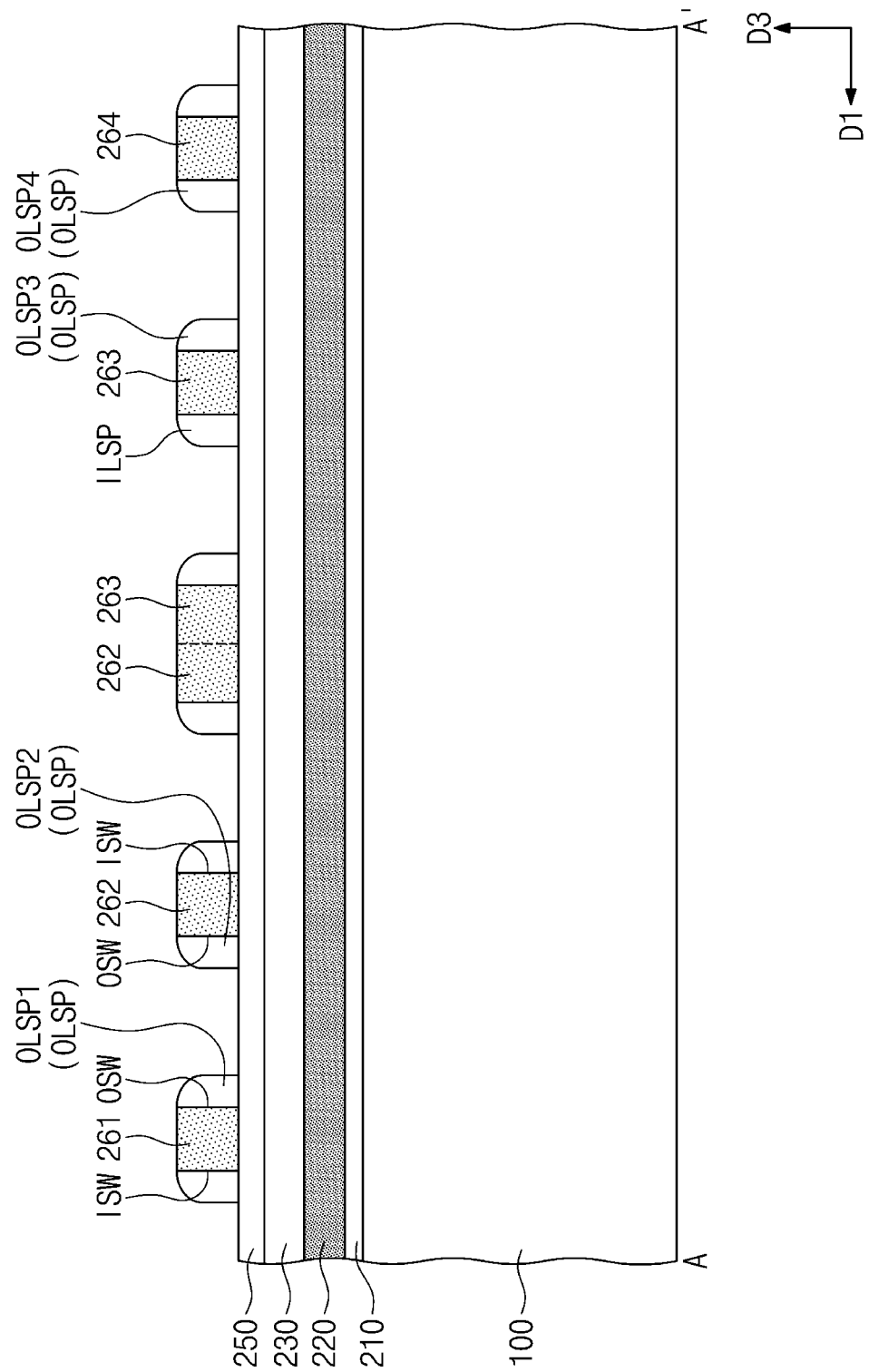

Referring to FIGS. 6A and 6B, inner lower spacers ILSP may be formed on the inner sidewalls ISW of the first to fourth lower sacrificial patterns 261 to 264, and outer lower spacers OLSP may be formed on the outer sidewalls OSW of the first to fourth lower sacrificial patterns 261 to 264. The formation of the inner and outer lower spacers ILSP and OLSP may include conformally forming a lower spacer layer on the entire surface of the substrate 100 and performing an etch-back process. The lower spacer layer may include a material having an etch selectivity with respect to the first to fourth lower sacrificial patterns 261 to 264. For example, the lower spacer layer may include silicon oxide or silicon nitride. The lower spacer layer may be conformally formed by an atomic layer deposition (ALD) process.

The outer lower spacers OLSP may include first to fourth outer lower spacers OLSP1 to OLSP4. The first outer lower spacer OLSP1 may be formed on the outer sidewall OSW of the first lower sacrificial pattern 261, the second outer lower spacer OLSP2 may be formed on the outer sidewall OSW of the second lower sacrificial pattern 262, the third outer lower spacer OLSP3 may be formed on the outer sidewall OSW of the third lower sacrificial pattern 263, and the fourth outer lower spacer OLSP4 may be formed on the outer sidewall OSW of the fourth lower sacrificial pattern 264.

The first and second outer lower spacers OLSP1 and OLSP2 may be spaced apart from each other in the first direction D1. The third and fourth outer lower spacers OLSP3 and OLSP4 may be spaced apart from each other in the first direction D1. The second and third outer lower spacers OLSP2 and OLSP3 may be connected to each other. For example, the second and third outer lower spacers OLSP2 and OLSP3 may be combined into a single body (e.g., a monolithic structure).

Figure 7A:
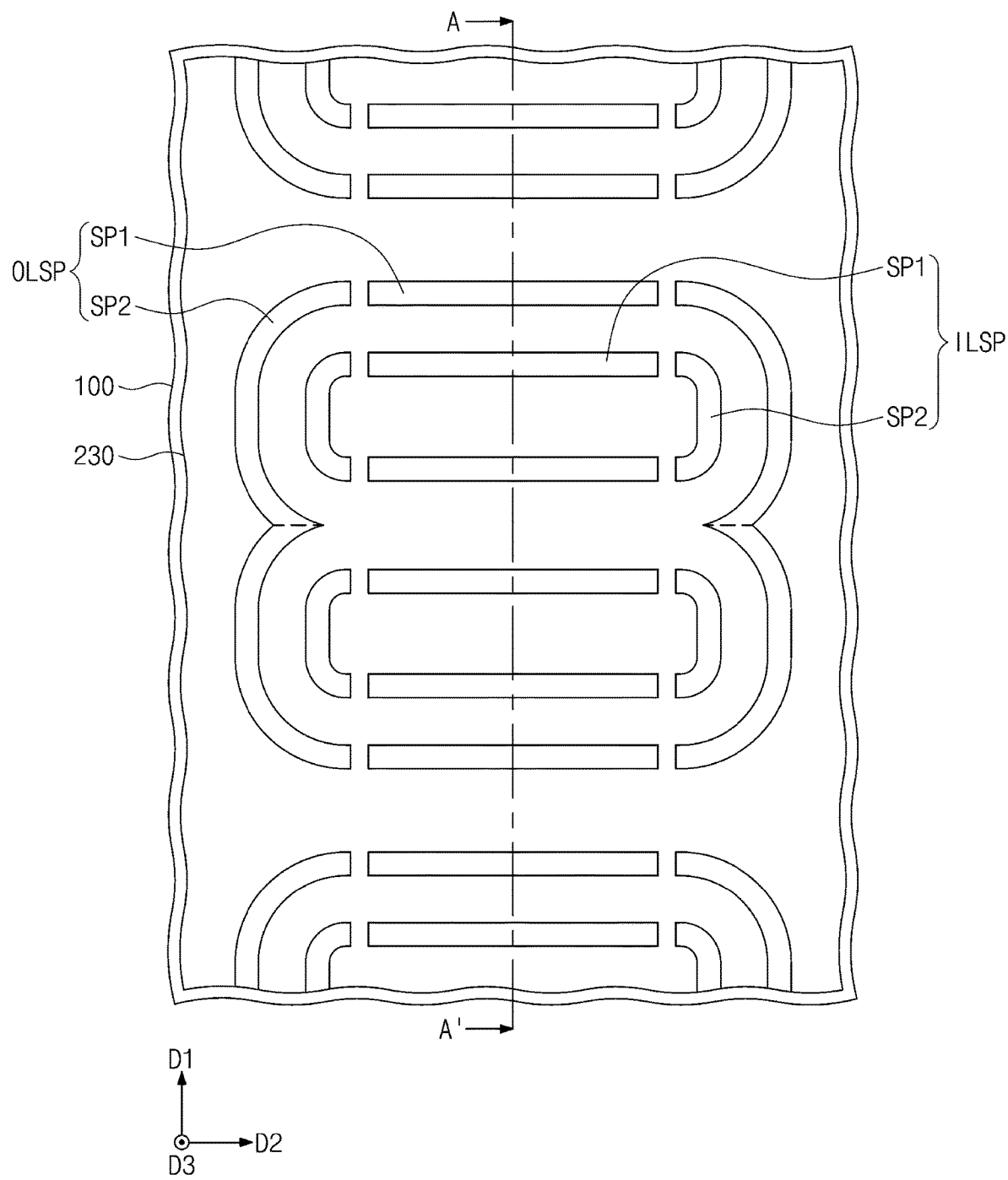

Referring to FIGS. 7A and 7B, the first to fourth lower sacrificial patterns 261 to 264 may be removed. Because the first to fourth lower sacrificial patterns 261 to 264 have an etch selectivity with respect to the outer lower spacers OLSP and the inner lower spacers ILSP, the first to fourth lower sacrificial patterns 261 to 264 may be selectively removed under a specific etching condition.

The outer and inner lower spacers OLSP and ILSP may be used as an etching mask to pattern the fourth mask layer 250. The fourth mask layer 250 may be patterned to form fourth mask patterns 251.

A side-cut process may be performed to pattern the outer lower spacers OLSP, the inner lower spacers ILSP, and the fourth mask patterns 251. The side-cut process may include performing a photolithography process to pattern the outer and inner lower spacers OLSP and ILSP and using the patterned outer and inner lower spacers OLSP and ILSP as an etching mask to pattern the fourth mask patterns 251.

The side-cut process may form first segments SP1 and second segments SP2 of each of the outer and inner lower spacers OLSP and ILSP. The second segments SP2 may be curved portions when viewed in plan. The first segments SP1 may be portions each having a linear or bar shape extending lengthwise along a second direction D2. The first and second segments SP1 and SP2 may be spaced apart from each other in the second direction D2. A pair of the second segments SP2 may be disposed on opposite sides of the first segment SP1.

The fourth mask patterns 251 patterned by the side-cut process may vertically overlap the first and second segments SP1 and SP2 of each of the outer and inner lower spacers OLSP and ILSP. For example, the fourth mask patterns 251 patterned by the side-cut process may have their planar shapes substantially the same as those of the first and second segments SP1 and SP2 of each of the outer and inner lower spacers OLSP and ILSP.

Figure 8A:
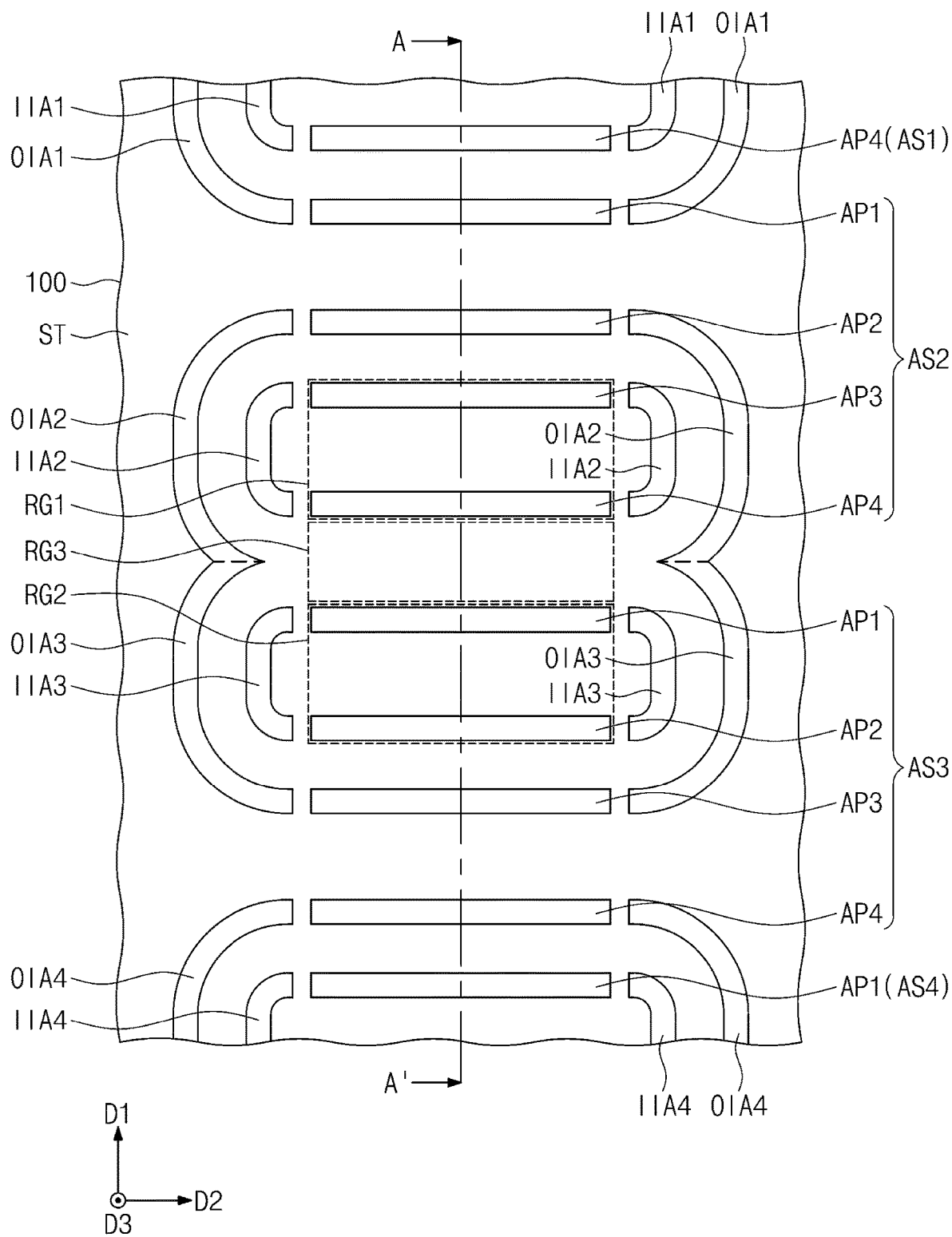
Figure 8B:
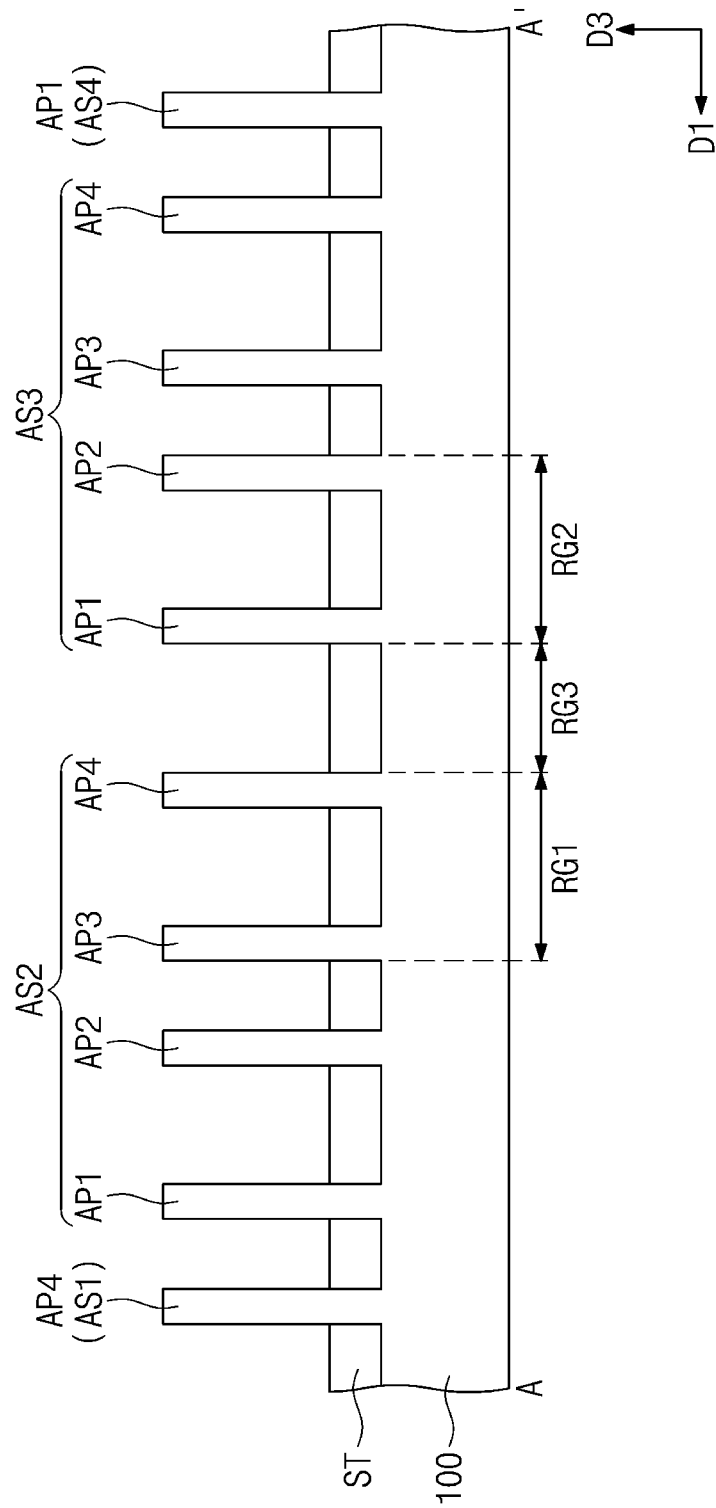

Referring to FIGS. 8A and 8B, the fourth mask patterns 251 and the first and second segments SP1 and SP2 of each of the outer and inner lower spacers OLSP and ILSP may be used as an etching mask to pattern the first, second, and third mask layers 210, 220, and 230 and a portion of the substrate 100. The third mask layer 230 may be patterned to form third mask patterns (not shown), the second mask layer 220 may be patterned to form second mask patterns (not shown), and the first mask layer 210 may be patterned to form first mask patterns (not shown). The substrate 100 may be partially patterned to form, on an upper portion thereof, active structures AS1 to AS4, outer inactive patterns OIA1 to OIA4, and inner inactive patterns IIA1 to IIA4.

According to some example embodiments of the present inventive concepts, a plurality of active patterns AP1 to AP4 may be formed by a quadruple patterning technology (QPT) process in which the second and third upper sacrificial patterns 282 and 283 are used as mandrels. The QPT process may include the formation of upper spacers and the formation of lower spacers, as discussed above. For example, when the second upper sacrificial pattern 282 is formed on a first region RG1 of the substrate 100, and when the third upper sacrificial pattern 283 is formed on a second region RG2 of the substrate 100, two ones of the active patterns AP1 to AP4 may be eventually formed on each of the first and second regions RG1 and RG2. No active pattern may be formed on a third region RG3 between the first and second regions RG1 and RG2.

After the patterning process, a removal process may be performed on remaining outer and inner lower spacers OLSP and ILSP, the fourth mask patterns 251, and the first to third mask patterns (not shown).

A device isolation layer ST may be formed to allow the active structures AS1 to AS4, the outer inactive patterns OIA1 to OIA4, and the inner inactive patterns IIA1 to IIA4 to vertically protrude from the device isolation layer ST. The formation of the device isolation layer ST may include forming a dielectric layer on the entire surface of the substrate 100, performing a planarization process to expose top surfaces of the second mask patterns, removing the first and second mask patterns, and removing an upper portion of the dielectric layer so as to vertically protrude the active structures AS1 to AS4, the outer inactive patterns OIA1 to OIA4, and the inner inactive patterns IIA1 to IIA4. The planarization process may include a chemical mechanical polishing (CMP) process. The dielectric layer may include a dielectric material (e.g., a silicon oxide layer).

Referring back to FIGS. 1A, 1B, 1C, and 1D, gate electrodes GE may be formed to run across the active structures AS1 to AS4 on the substrate 100, and then gate capping patterns GP and gate spacers GS may be formed.

First source/drain patterns SD1 may be formed on the first and fourth active patterns AP1 and AP4, and second source/drain patterns SD2 may be formed on the second and third active patterns AP2 and AP3.

A selective epitaxial growth process may be performed to form the first and second source/drain patterns SD1 and SD2. The selective epitaxial growth process may include, for example, a chemical vapor deposition (CVD) process or a molecular beam epitaxy (MBE) process. Simultaneously during or after the selective epitaxial growth process, the first source/drain patterns SD1 may be doped with n-type impurities, and the second source/drain patterns SD2 may be doped with p-type impurities.

A first interlayer dielectric layer 110 and a second interlayer dielectric layer 120 may be formed on the entire surface of the substrate 100.

Active contacts AC may be formed to penetrate the first and second interlayer dielectric layers 110 and 120 and to have connection with the first and second source/drain patterns SD1 and SD2. Gate contacts GC may be formed to penetrate the second interlayer dielectric layer 120 and the gate capping patterns GP and to have connection with the gate electrodes GE. The formation of the active contacts AC and the gate contacts GC may include forming holes to define areas where the active contacts AC and the gate contacts GC are formed and forming a conductive layer to fill the holes.

In a method of fabricating a semiconductor device according to the present inventive concepts, a removal process of active patterns may be omitted to reduce fabrication cost and time.

Figure 9A:
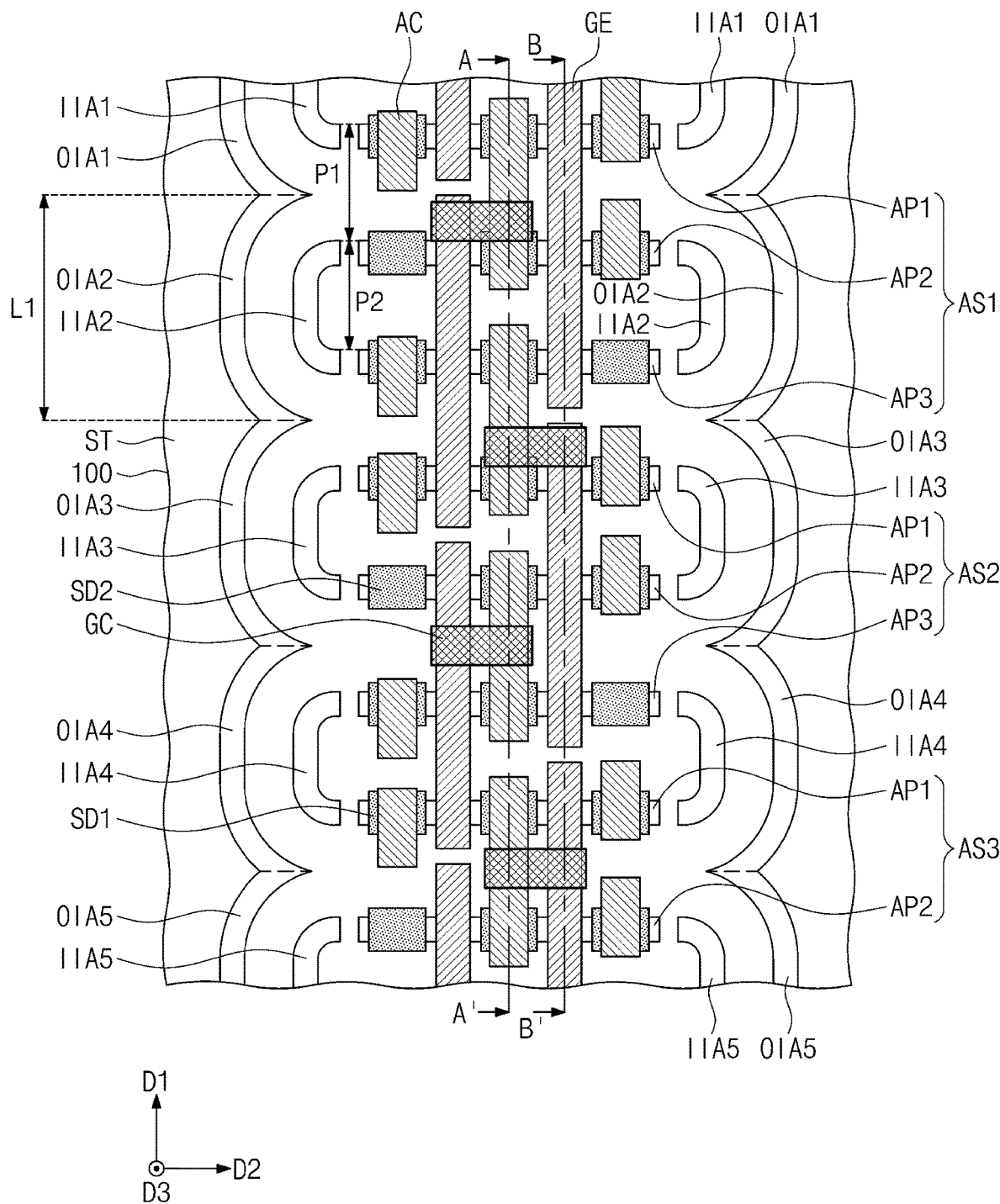
FIG. 9A illustrates a plan view showing a semiconductor device according to some example embodiments of the present inventive concepts.
Figure 9B:
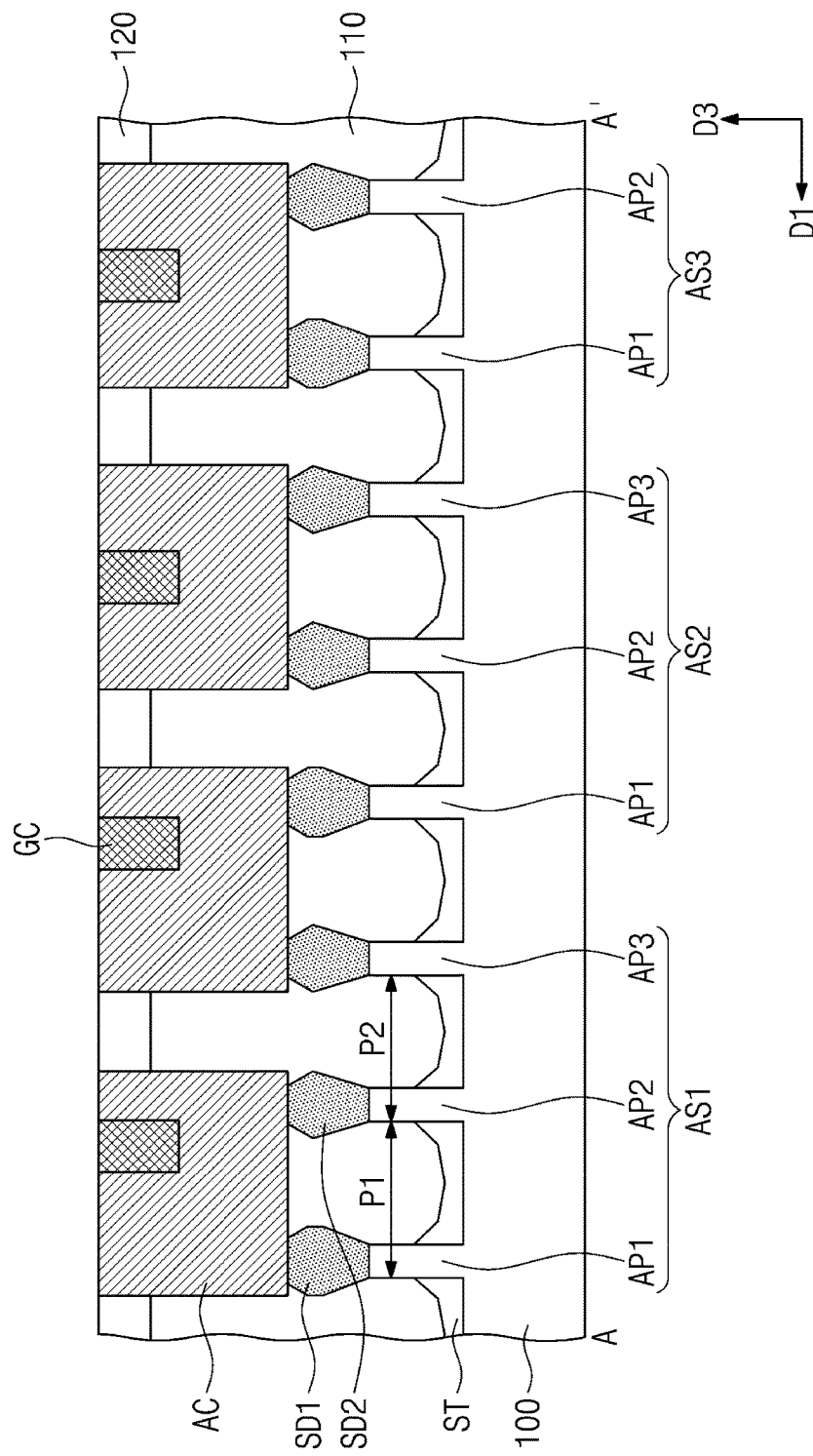
FIG. 9B illustrates a cross-sectional view taken along line A-A' of FIG. 9A.
Figure 9C:
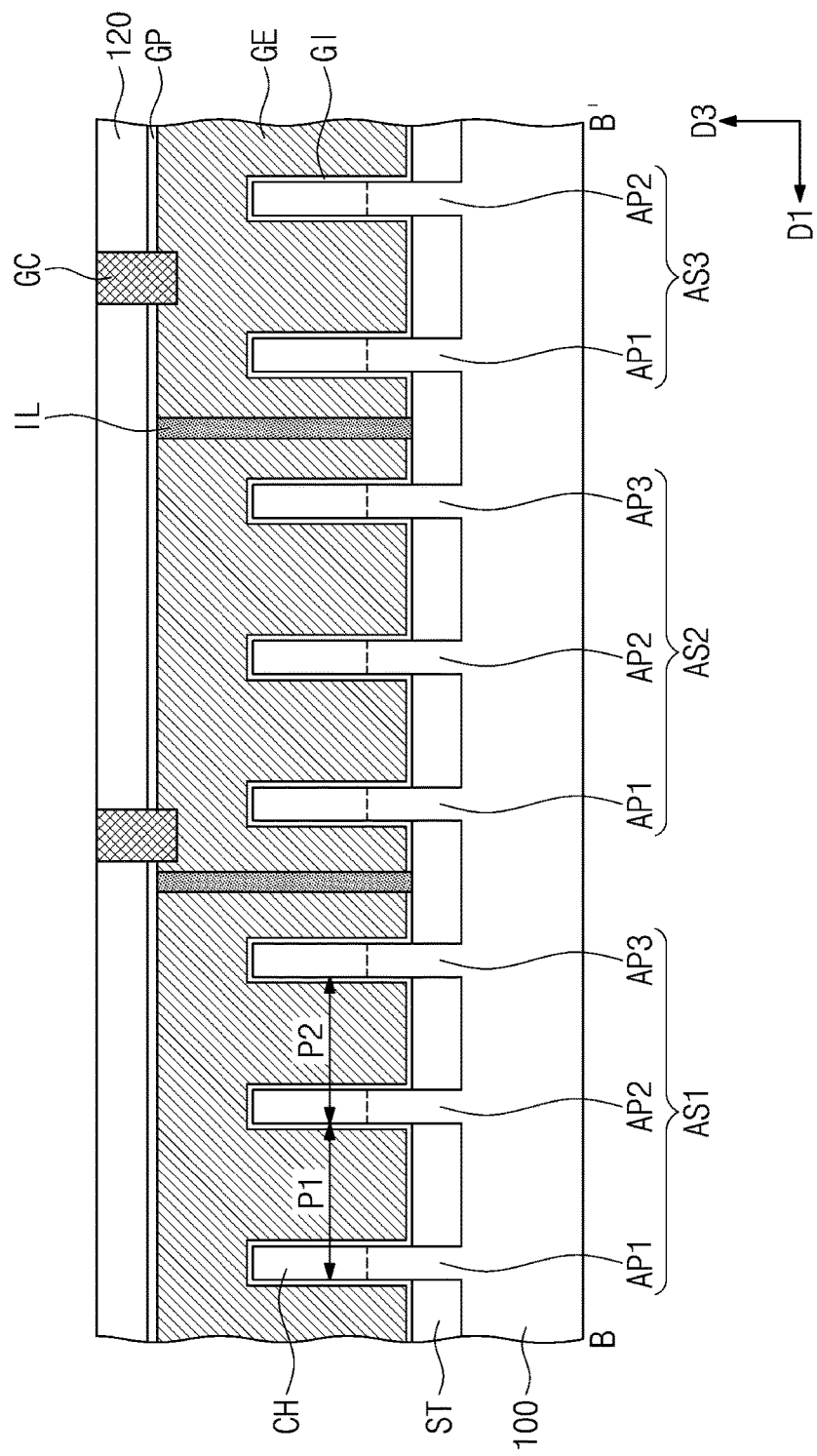
FIG. 9C illustrates a cross-sectional view taken along line B-B' of FIG. 9A.

FIG. 9A illustrates a plan view showing a semiconductor device according to some example embodiments of the present inventive concepts. FIG. 9B illustrates a cross-sectional view taken along line A-A' of FIG. 9A. FIG. 9C illustrates a cross-sectional view taken along line B-B' of FIG. 9A.

For brevity of description, the same components as those discussed with reference to FIGS. 1A, 1B, 1C, and 1D are allocated the same reference numerals thereto, and a duplicate explanation will be omitted.

Referring to FIGS. 9A, 9B, and 9C, a device isolation layer ST may be provided on a substrate 100. The device isolation layer ST may define active structures AS1 to AS3, outer inactive patterns OIA1 to OIA5, and inner inactive patterns IIA1 to IIA5 on an upper portion of the substrate 100.

The active structures AS1 to AS3 may include first to third active structures AS1 to AS3. Each of the first to third active structures AS1 to AS3 may include first to third active patterns AP1 to AP3.

A first pitch P1 may be provided between the first and second active patterns AP1 and AP2 of the first active structure AS1. A second pitch P2 may be provided between the second and third active patterns AP2 and AP3 of the first active structure AS1. The first and second pitches P1 and P2 may be substantially the same.

The outer inactive patterns OIA1 to OIA5 may be disposed on opposite sides of the active structures AS1 to AS3, and the inner inactive patterns IIA1 to IIA5 may also be disposed on the opposite sides of the active structures AS1 to AS3. The outer inactive patterns OIA1 to OIA5 may include first to fifth outer inactive patterns OIA1 to OIA5. The inner inactive patterns IIA1 to IIA5 may include first to fifth inner inactive patterns IIA1 to IIA5.

A pair of the inner inactive patterns IIA1 to IIA5 may be spaced apart in a second direction D2 from each other with the active patterns AP1 to AP3 therebetween. For example, a pair of the second inner inactive patterns IIA2 may be spaced apart in the second direction D2 from each other with the second and third active patterns AP2 and AP3 of the first active structure AS1 therebetween.

A pair of the outer inactive patterns OIA1 to OIA5 may be spaced apart in the second direction D2 from each other with the active patterns AP1 to AP3 and the inner inactive patterns IIA1 to IIA5 therebetween. For example, a pair of the second outer inactive patterns OIA2 may be spaced apart in the second direction D2 from each other with the second inner inactive patterns IIA2 and the second and third active patterns AP2 and AP3 of the first active structure AS1 therebetween.

As discussed above, two of the active patterns AP1 to AP3 may be disposed between a pair of the outer inactive patterns OIA1 to OIA5, where the individual ones of each pair are opposite one other in the second direction D2.

The first to fifth outer inactive patterns OIA1 to OIA5 may be connected to each other. For example, the first to fifth outer inactive patterns OIA1 to OIA5 may be combined into a single body (e.g., a monolithic structure).

The second outer inactive pattern OIA2 may have a first length L1 corresponding to a maximum length in a first direction D1 thereof. The first length L1 may be substantially the same as a sum of the first and second pitches P1 and P2.

First source/drain patterns SD1 may be provided on each of the first active patterns AP1. Second source/drain patterns SD2 may be provided on each of the second and third active patterns AP2 and AP3. The first source/drain patterns SD1 may be n-type impurity regions. The second source/drain patterns SD2 may be p-type impurity regions.

The first source/drain patterns SD1 may define a channel CH on an upper portion of each of the first active patterns AP1, and the second source/drain patterns SD2 may define a channel CH on an upper portion of each of the second and third active patterns AP2 and AP3.

FIGS. 10A, 11A, 12A, 13A, 14A, 15A, and 16A illustrate plan views showing a method of fabricating a semiconductor device depicted in FIGS. 9A, 9B, and 9C. FIGS. 10B, 11B, 12B, 13B, 14B, 15B, and 16B illustrate cross-sectional views taken along line A-A' of FIGS. 10A, 11A, 12A, 13A, 14A, 15A, and 16A, respectively.

For brevity of description, the same components as those discussed with reference to FIGS. 2A, 2B, 3A, 3B, 4A, 4B, 5A, 5B, 6A, 6B, 7A, 7B, 8A, and 8B are allocated the same reference numerals thereto, and a repetitive explanation will be omitted.

Figure 10A:
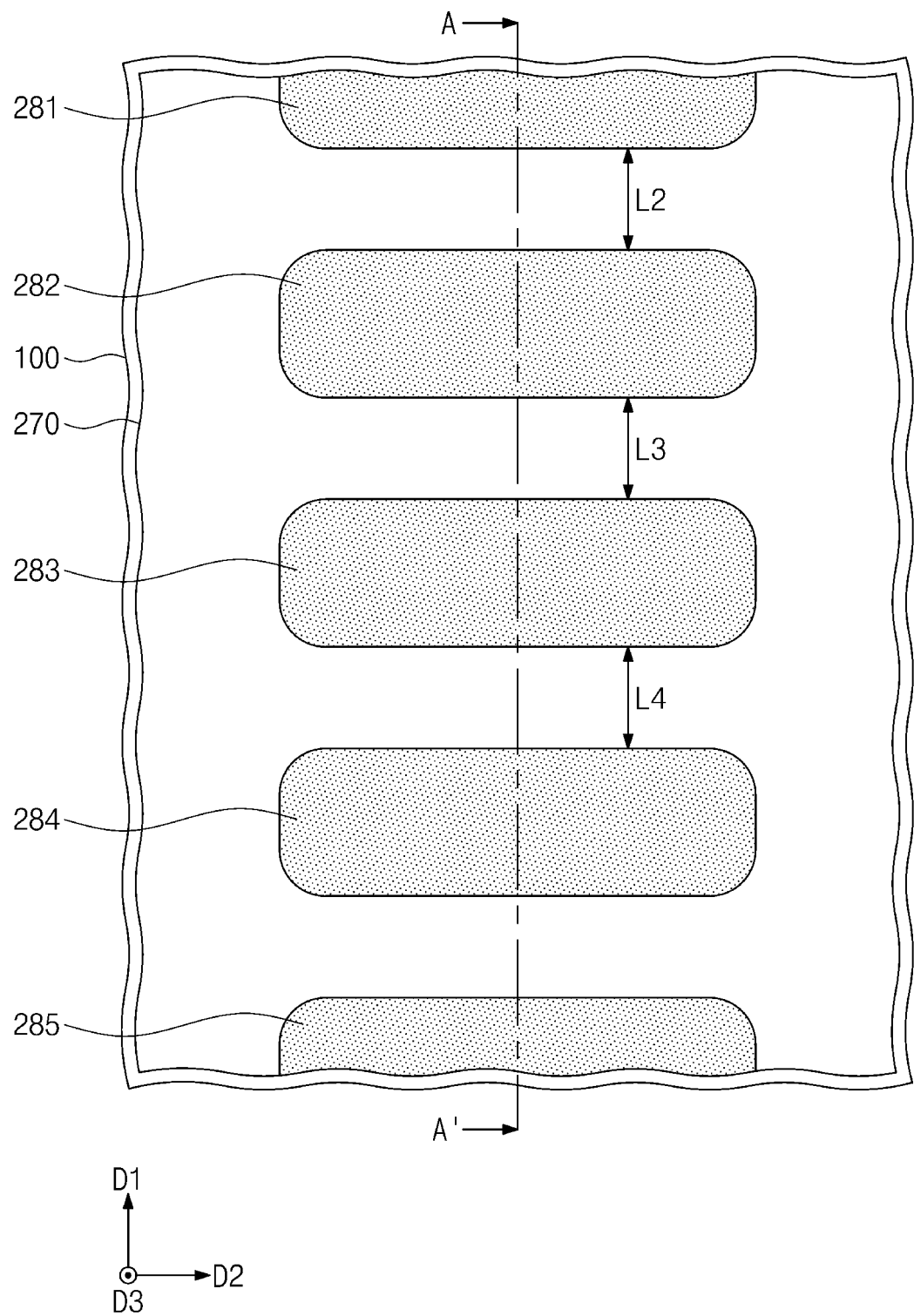
FIGS. 10A, 11A, 12A, 13A, 14A, 15A, and 16A illustrate plan views showing a method of fabricating a semiconductor device depicted in FIGS. 9A, 9B, and 9C.

Referring to FIGS. 10A and 10B, a substrate 100 may be sequentially provided thereon with a first mask layer 210, a second mask layer 220, a third mask layer 230, a fourth mask layer 250, a lower sacrificial layer 260, a fifth mask layer 270, and an upper sacrificial layer (not shown).

The upper sacrificial layer may be patterned to form upper sacrificial patterns 281 to 285. The upper sacrificial patterns 281 to 285 may include first to fifth upper sacrificial patterns 281 to 285. Five upper sacrificial patterns 281 to 285 are illustrated, but the number of the upper sacrificial patterns 281 to 285 may not be limited to five.

The first to fifth upper sacrificial patterns 281 to 285 may be arranged along a first direction D1. The first to fifth upper sacrificial patterns 281 to 285 may be spaced apart from each other along the first direction D1. A second length L2 may be provided as a minimum length in the first direction D1 between the first and second upper sacrificial patterns 281 and 282. A third length L3 may be provided as a minimum length in the first direction D1 between the second and third upper sacrificial patterns 282 and 283. A fourth length L4 may be provided as a minimum length in the first direction D1 between the third and fourth upper sacrificial patterns 283 and 284. The second to fourth lengths L2 to L4 may be substantially the same.

Figure 11A:
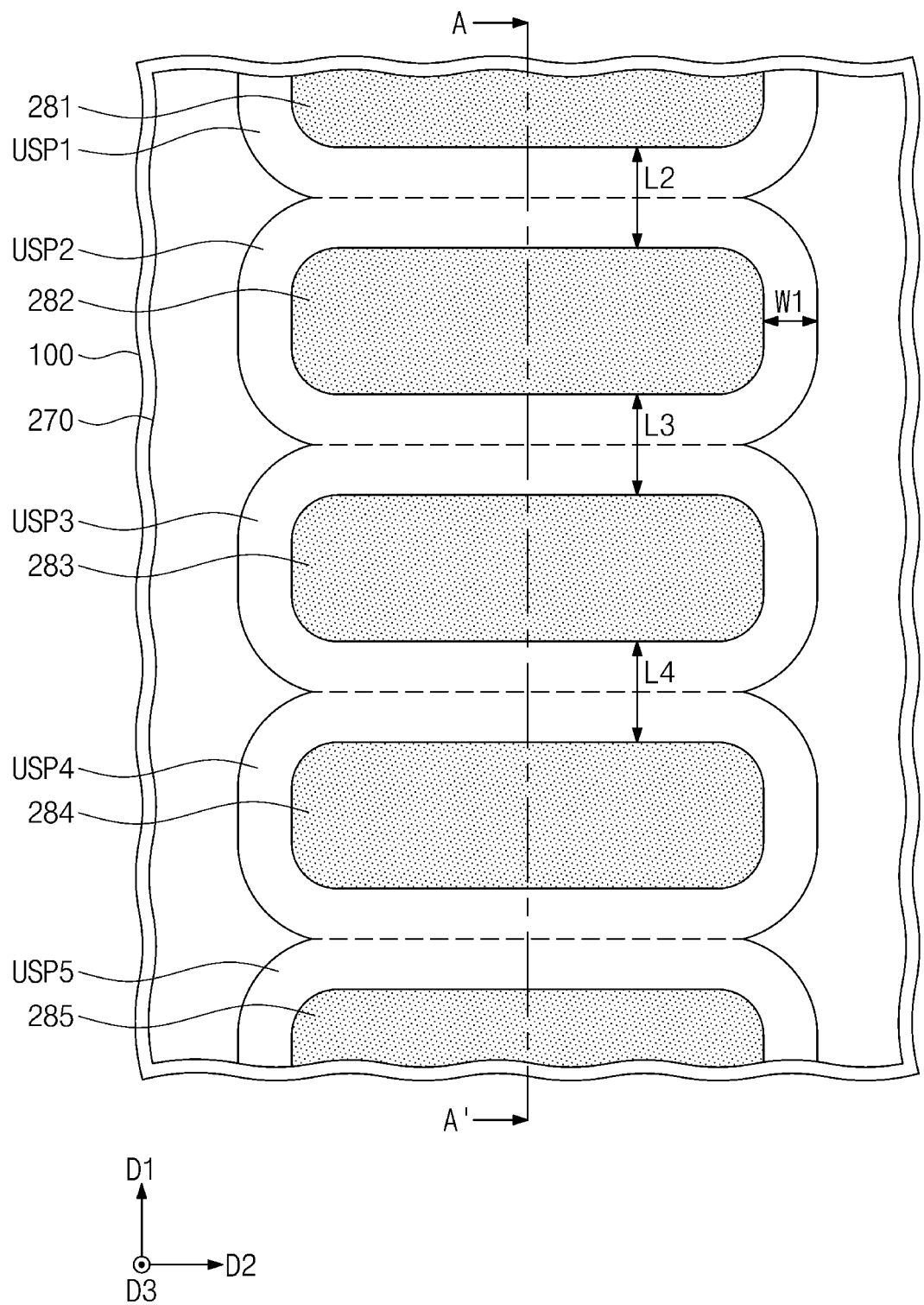
Figure 11B:
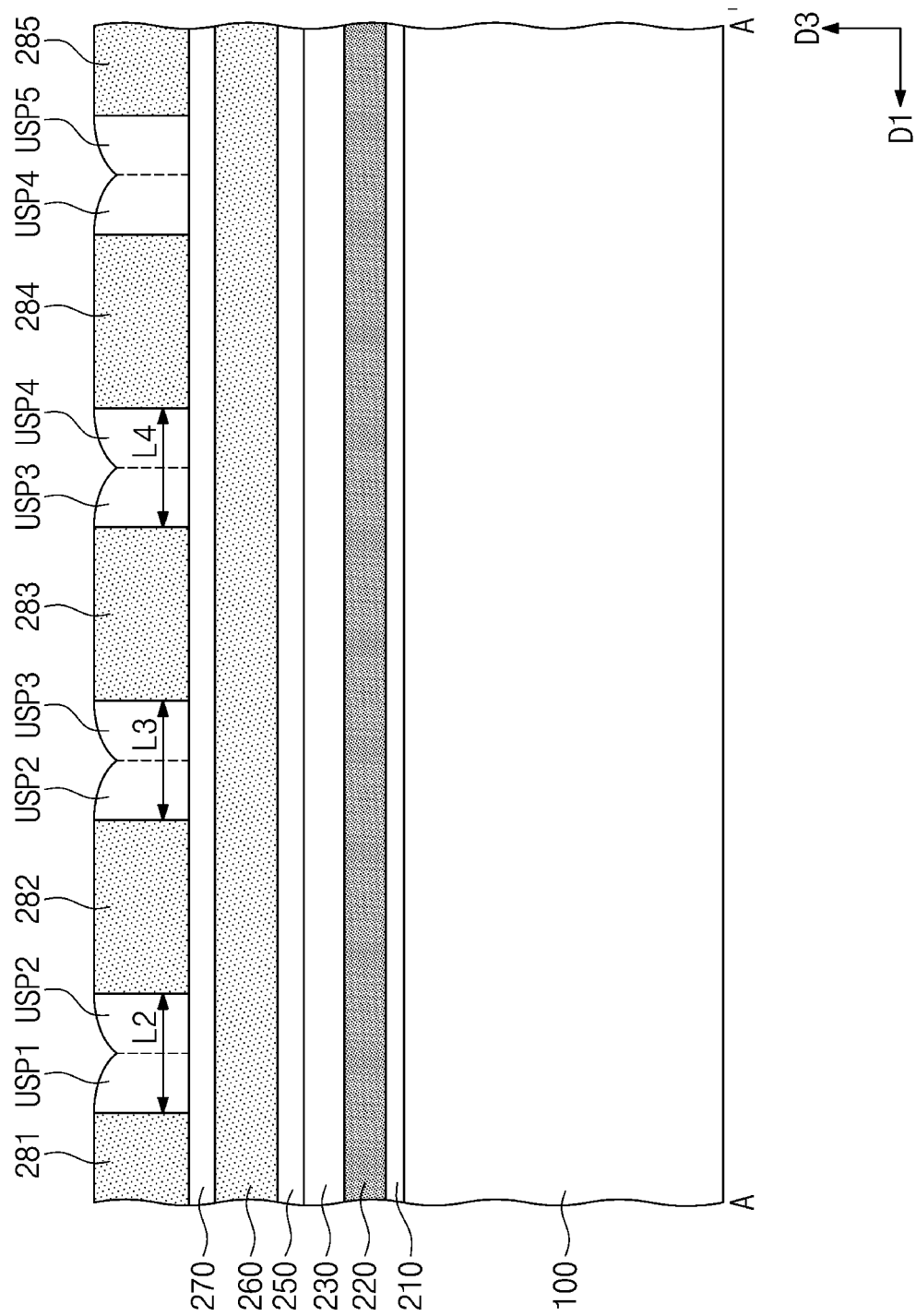

Referring to FIGS. 11A and 11B, first to fifth upper spacers USP1 to USP5 may be formed on sidewalls of the first to fifth upper sacrificial patterns 281 to 285.

The first to fifth upper spacers USP1 to USP5 may be connected to each other. For example, the first to fifth upper spacers USP1 to USP5 may be combined into a single body (e.g., a monolithic structure).

Each of the first to fifth upper spacers USP1 to USP5 may have a first width W1 corresponding to a maximum width thereof. The widths of the first to fifth upper spacers USP1 to USP5 may correspond to the distance between inner and outer surfaces of the first to fifth upper spacers USP1 to USP5. Twice the first width W1 may be greater than or substantially the same as each of the second to fourth lengths L2 to L4. For example, twice the first width W1 may be greater than or substantially the same as the minimum length in the first direction D1 between the first and second upper sacrificial patterns 281 and 282, the minimum length in the first direction D1 between the second and third upper sacrificial patterns 282 and 283, or the minimum length in the first direction D1 between the third and fourth upper sacrificial patterns 283 and 284.

Figure 12A:
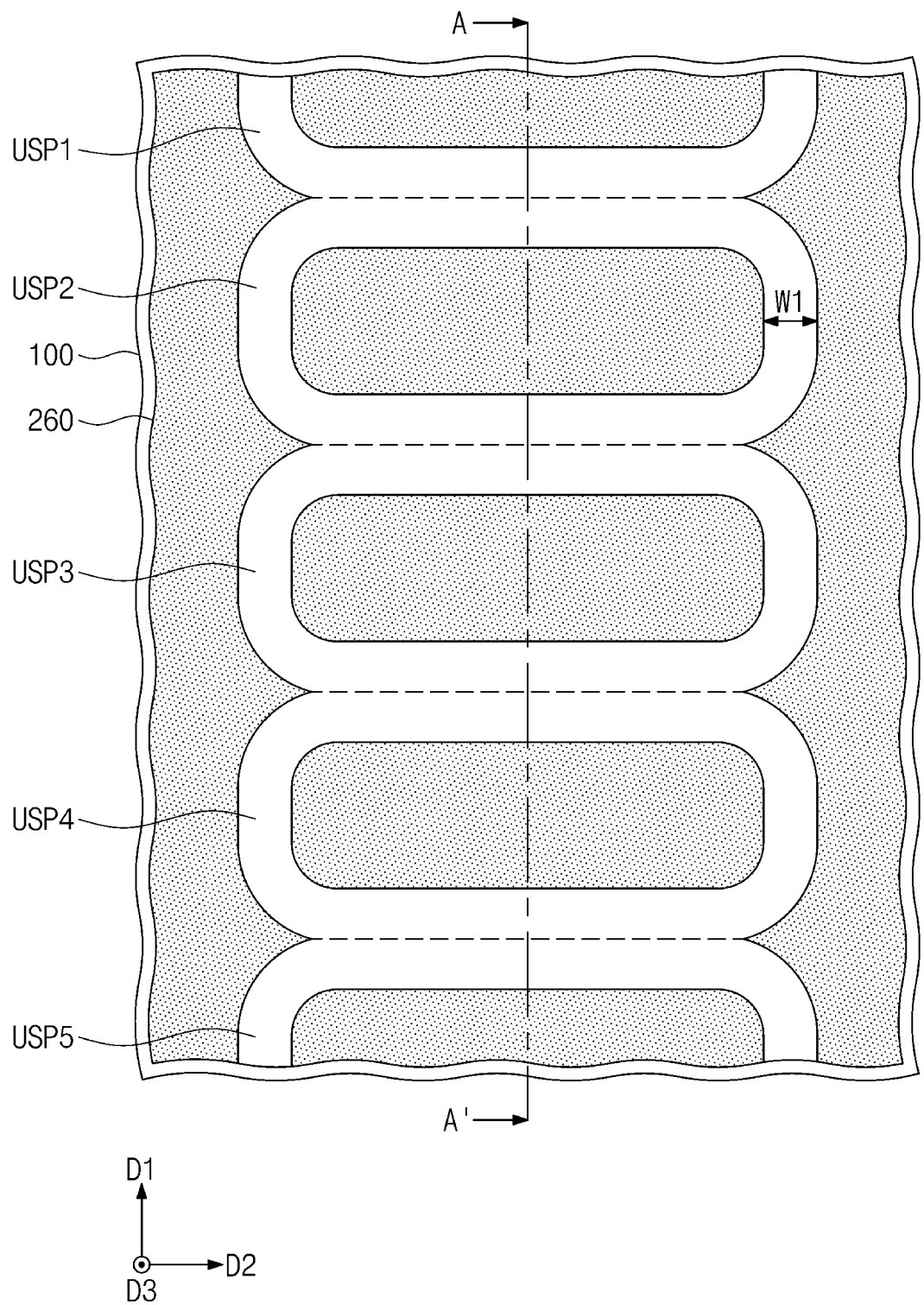
Figure 12B:
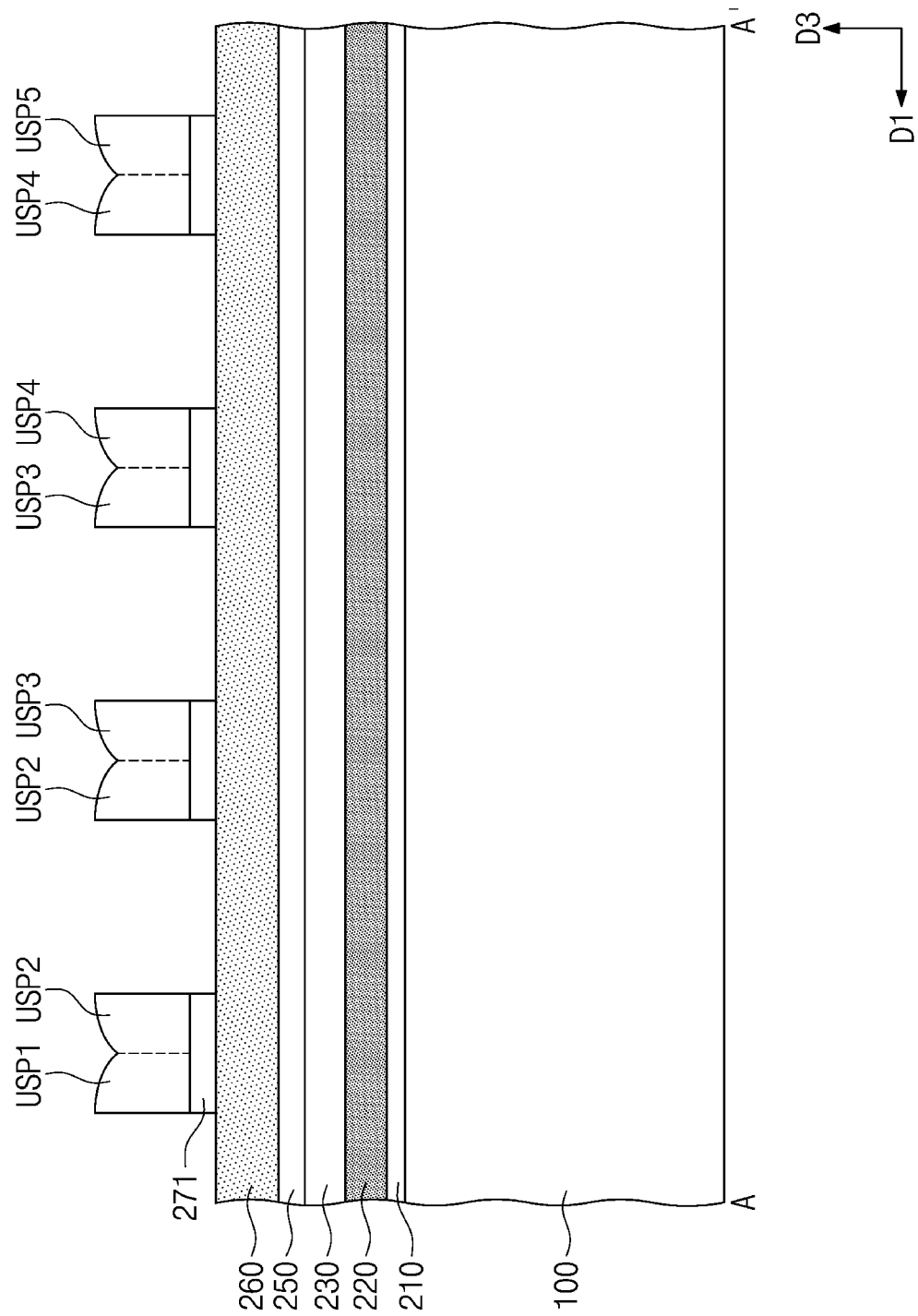

Referring to FIGS. 12A and 12B, the first to fifth upper sacrificial patterns 281 to 285 may be removed.

The first to fifth upper spacers USP1 to USP5 may be used as an etching mask to pattern the fifth mask layer 270. The fifth mask layer 270 may be patterned to form fifth mask patterns 271.

Figure 13A:
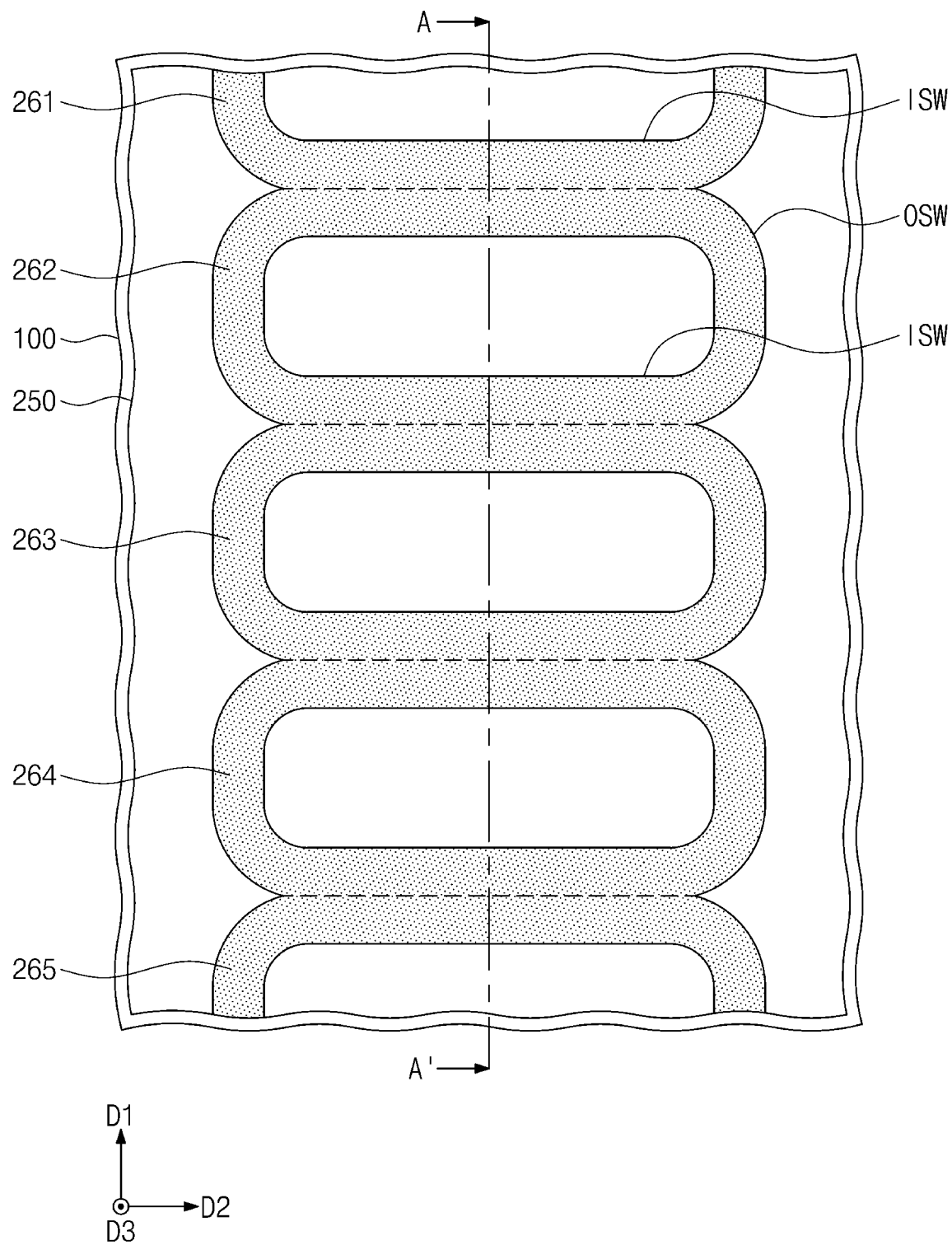
Figure 13B:
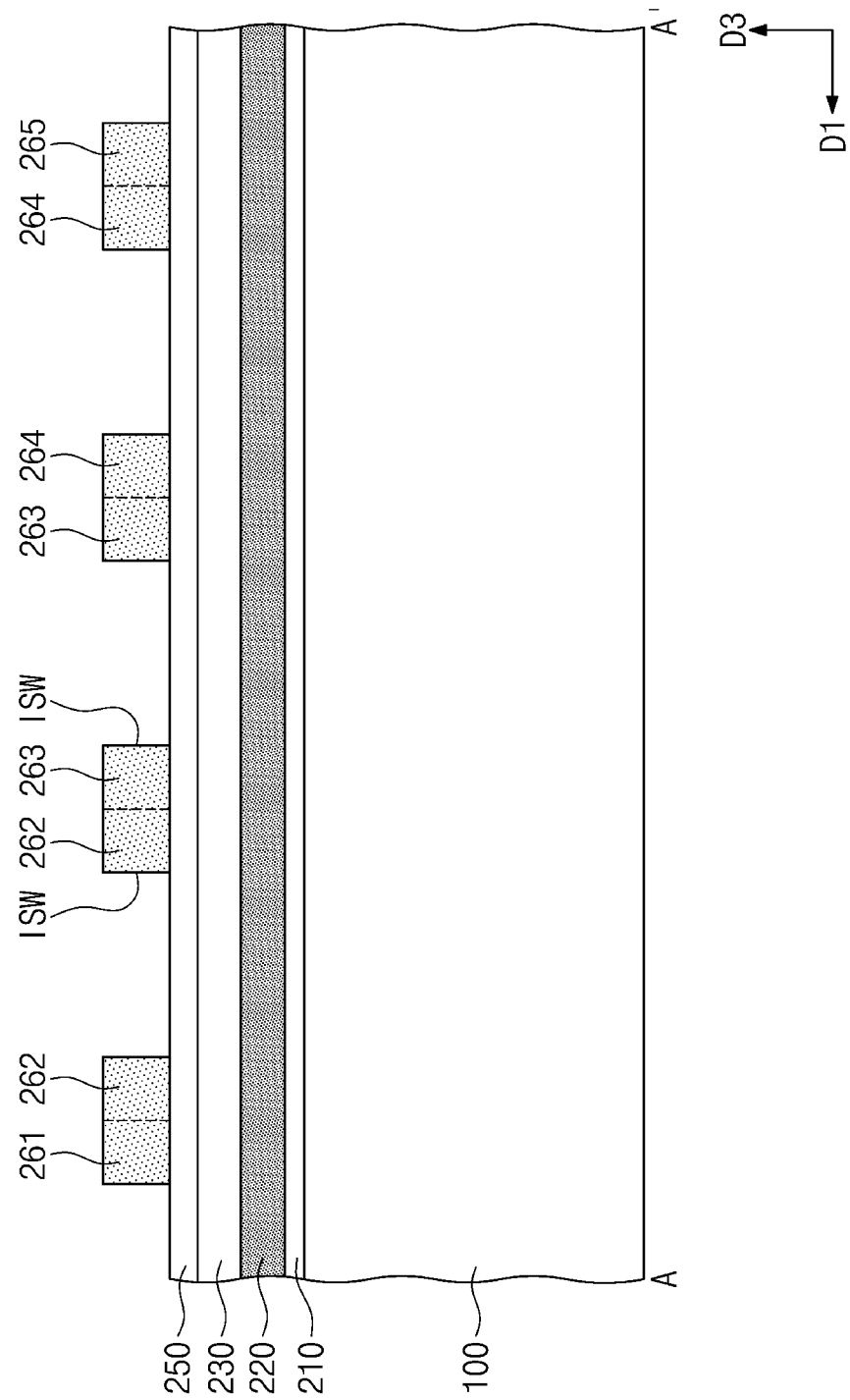

Referring to FIGS. 13A and 13B, the first to fifth upper spacers USP1 to USP5 and the fifth mask patterns 271 may be used as an etching mask to pattern the lower sacrificial layer 260. The lower sacrificial layer 260 may be patterned to form first to fifth lower sacrificial patterns 261 to 265.

The first to fifth lower sacrificial patterns 261 to 265 may vertically overlap the first to fifth upper spacers USP1 to USP5. For example, the first to fifth lower sacrificial patterns 261 to 265 may have a planar shape substantially the same as that of the first to fifth upper spacers USP1 to USP5.

Each of the first to fifth lower sacrificial patterns 261 to 265 may include an inner sidewall ISW and an outer sidewall OSW.

Figure 14A:
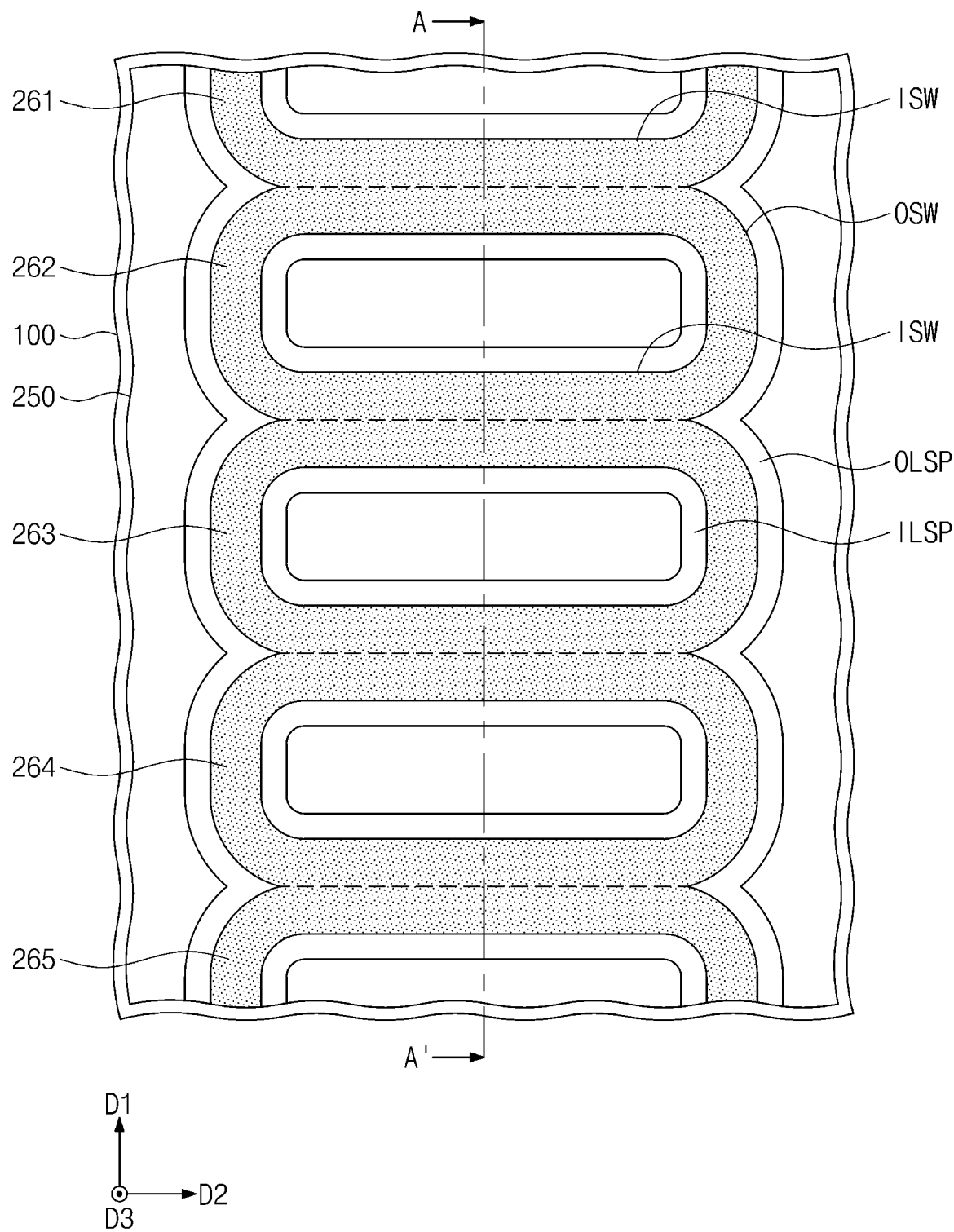
Figure 14B:
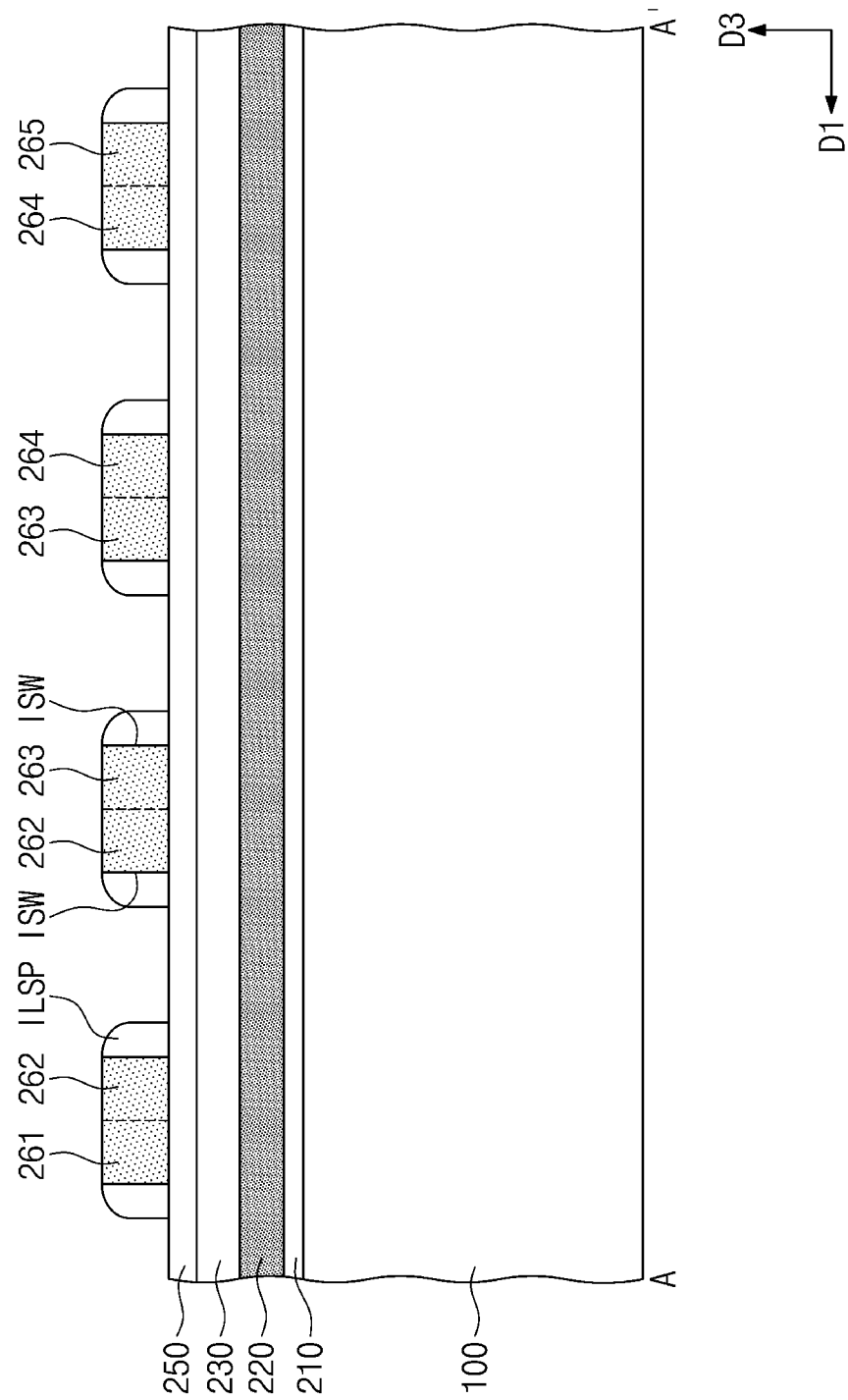

Referring to FIGS. 14A and 14B, inner lower spacers ILSP may be formed on the inner sidewalls ISW of the first to fifth lower sacrificial patterns 261 to 265, and outer lower spacers OLSP may be formed on the outer sidewalls OSW of the first to fifth lower sacrificial patterns 261 to 265.

The outer lower spacers OLSP may be connected to each other. For example, the outer lower spacers OLSP may be combined into a single body (e.g., a monolithic structure).

Figure 15A:
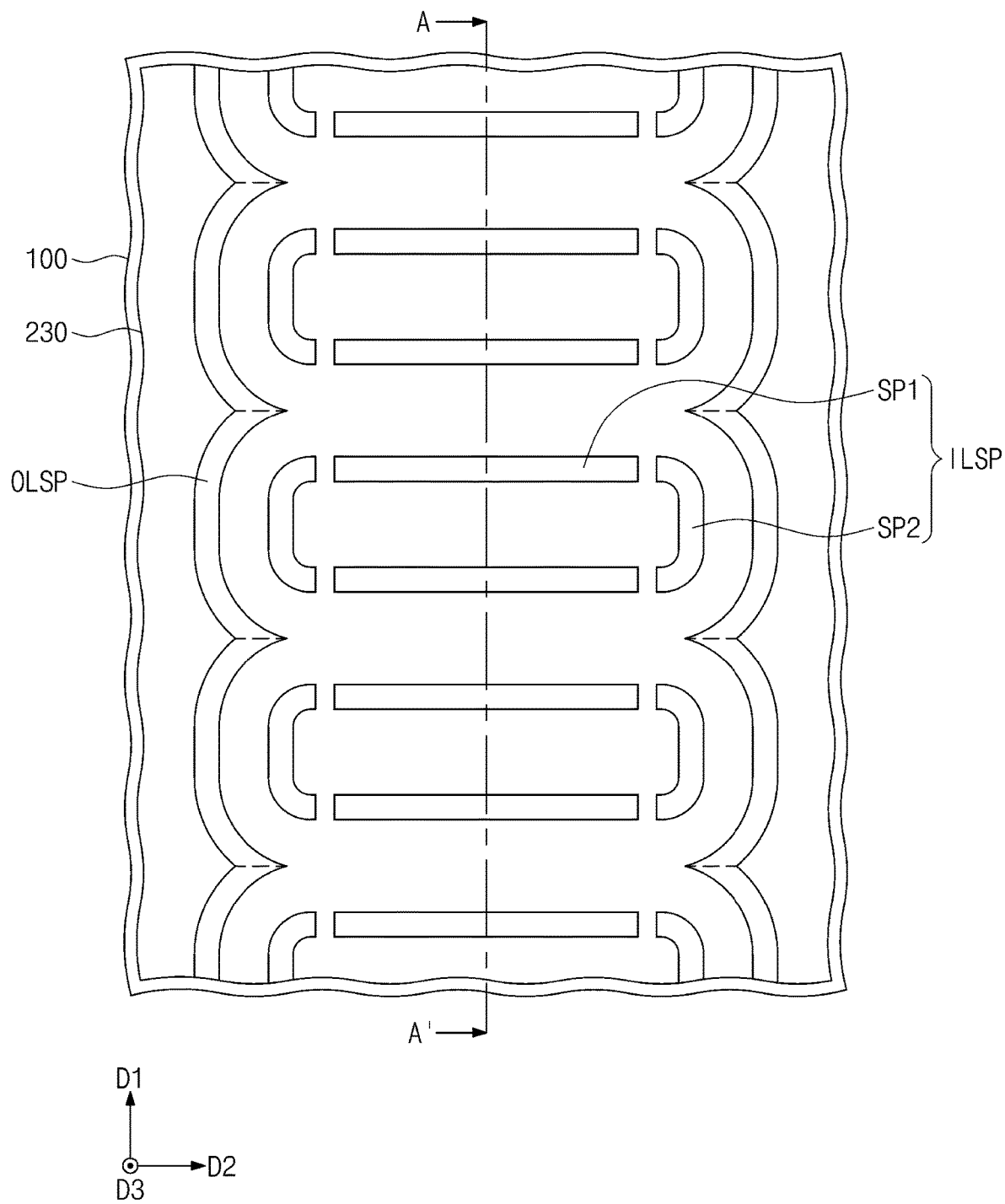
Figure 15B:
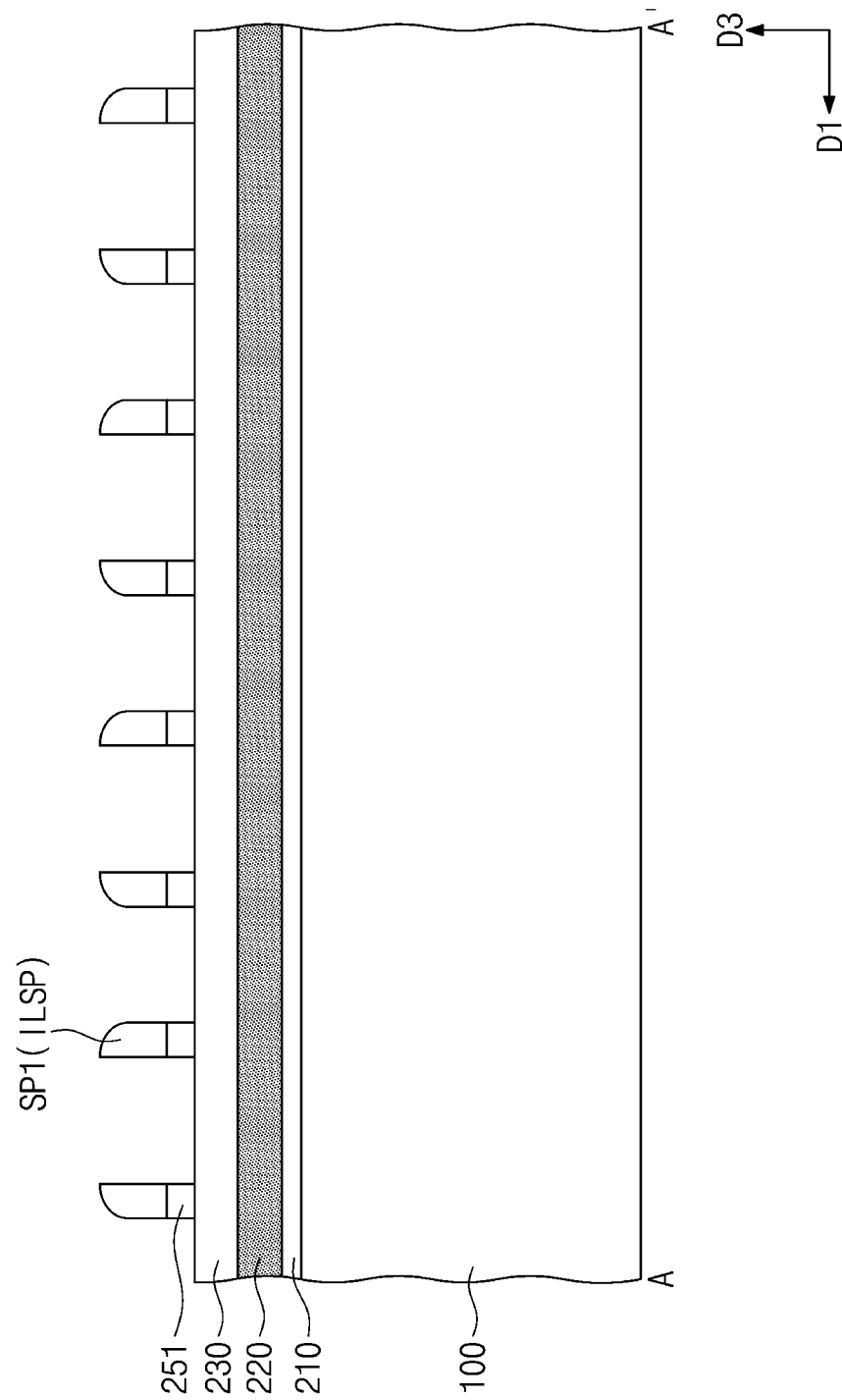

Referring to FIGS. 15A and 15B, the first to fifth lower sacrificial patterns 261 to 265 may be removed.

The outer and inner lower spacers OLSP and ILSP may be used as an etching mask to pattern the fourth mask layer 250. The fourth mask layer 250 may be patterned to form fourth mask patterns 251.

A side-cut process may be performed to pattern the inner lower spacers ILSP and the fourth mask patterns 251. The side-cut process may not pattern the outer lower spacers OLSP. For example, the side-cut process may have no effect on the outer lower spacers OLSP.

The side-cut process may form first segments SP1 and second segments SP2 of the inner lower spacers ILSP.

The fourth mask patterns 251 patterned by the side-cut process may vertically overlap the first and second segments SP1 and SP2 of the inner lower spacers ILSP.

Figure 16A:
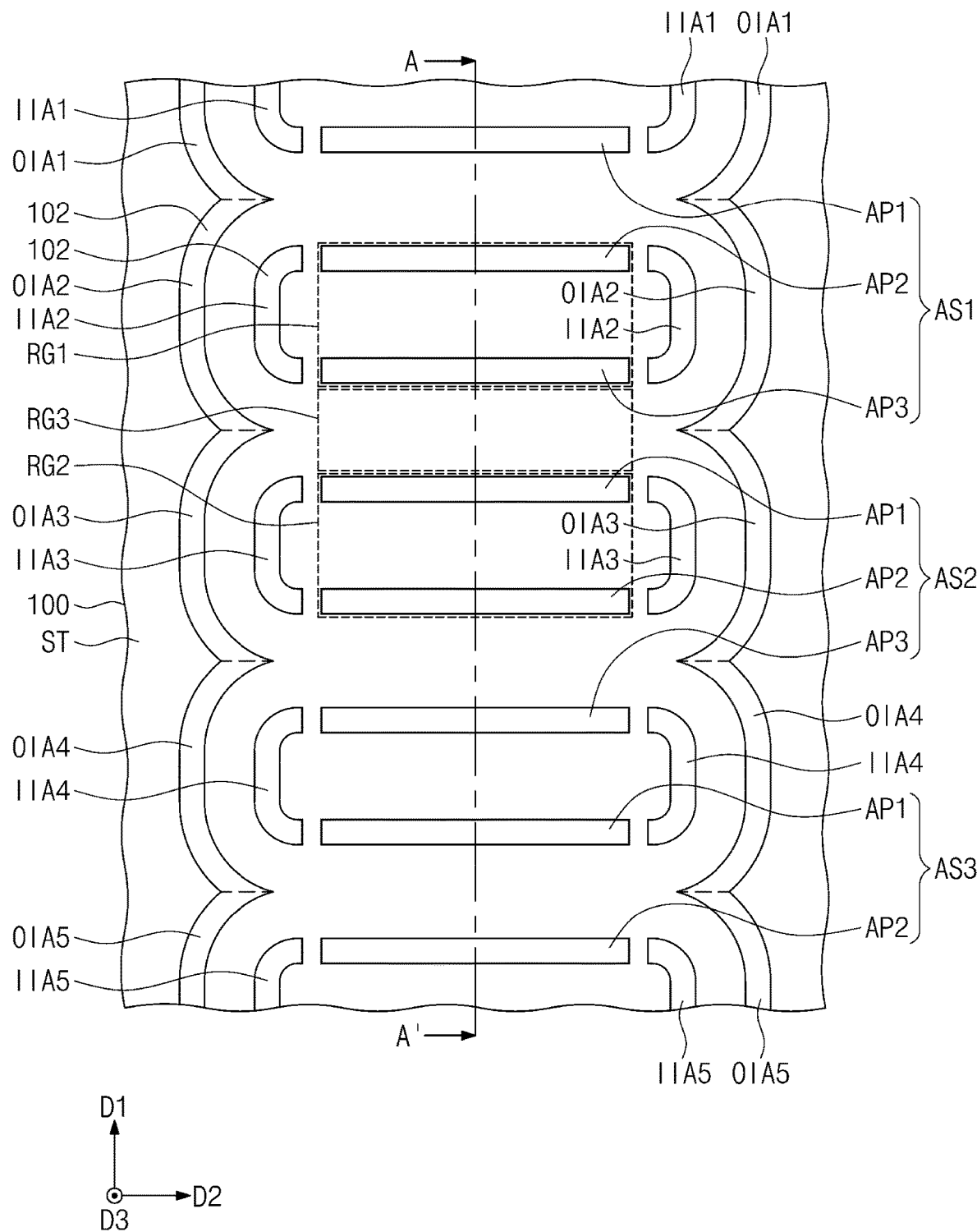

Referring to FIGS. 16A and 16B, the outer lower spacers OLSP, the first and second segments SP1 and SP2 of the inner lower spacers ILSP, and the fourth mask patterns 251 may be used as an etching mask to pattern the first, second, and third mask layers 210, 220, and 230 and a portion of the substrate 100. The third mask layer 230 may be patterned to form third mask patterns (not shown), the second mask layer 220 may be patterned to form second mask patterns (not shown), and the first mask layer 210 may be patterned to form first mask patterns (not shown). The substrate 100 may be partially patterned to form, on an upper portion thereof, active structures AS1 to AS3, outer inactive patterns OIA1 to OIA5, and inner inactive patterns IIA1 to IIA5.

According to some example embodiments of the present inventive concepts, a plurality of active patterns AP1 to AP3 may be formed by a quadruple patterning technology (QPT) process in which the second and third upper sacrificial patterns 282 and 283 are used as mandrels. The QPT process may include the formation of upper spacers and the formation of lower spacers, as discussed above. For example, when the second upper sacrificial pattern 282 is formed on a first region RG1 of the substrate 100, and when the third upper sacrificial pattern 283 is formed on a second region RG2 of the substrate 100, two ones of the active patterns AP1 to AP3 may be eventually formed on each of the first and second regions RG1 and RG2. No active pattern may be formed on a third region RG3 between the first and second regions RG1 and RG2. After the patterning process, a removal process may be performed on remaining outer and inner lower spacers OLSP and ILSP, the fourth mask patterns 251, and the first to third mask patterns.

A device isolation layer ST may be formed to allow the active structures AS1 to AS3, the outer inactive patterns OIA1 to OIA5, and the inner inactive patterns IIA1 to IIA5 to vertically protrude from the device isolation layer ST.

Referring back to FIGS. 9A, 9B, and 9C, gate electrodes GE may be formed to run across the active structures AS1 to AS3 on the substrate 100, and then gate capping patterns GP and gate spacers GS may be formed.

First source/drain patterns SD1 may be formed on the first active patterns AP1, and second source/drain patterns SD2 may be formed on the second and third active patterns AP2 and AP3.

A first interlayer dielectric layer 110 and a second interlayer dielectric layer 120 may be formed on an entire surface of the substrate 100. Active contacts AC may be formed to penetrate the first and second interlayer dielectric layers 110 and 120 and to have connection with the first and second source/drain patterns SD1 and SD2. Gate contacts GC may be formed to penetrate the second interlayer dielectric layer 120 and the gate capping patterns GP and to have connection with the gate electrodes GE.

In a method of fabricating a semiconductor device according to the present inventive concepts, a removal process of active patterns may be omitted to reduce fabrication cost and time.

Although exemplary embodiments of the present inventive concepts have been discussed with reference to accompanying figures, it will be understood that various changes in form and details may be made therein without departing from the spirit and scope of the present inventive concepts. It therefore will be understood that the some example embodiments described above are just illustrative but not limitative in all aspects.

What is claimed is:

1. A method of fabricating a semiconductor device, the method comprising:
    sequentially stacking a lower sacrificial layer and an upper sacrificial layer on a substrate;
    patterning the upper sacrificial layer to form a first upper sacrificial pattern and a second upper sacrificial pattern;
    forming a first upper spacer and a second upper spacer on sidewalls of the first upper sacrificial pattern and the second upper sacrificial pattern, respectively;
    patterning the lower sacrificial layer, using the first and second upper spacers as an etching mask, to form a plurality of lower sacrificial patterns;
    forming a plurality of lower spacers on sidewalls of the lower sacrificial patterns; and
    patterning the substrate using the plurality of lower spacers as an etching mask,
    wherein the first and second upper spacers are connected to each other.

2. The method of claim 1, wherein twice a maximum width of each of the first and second upper spacers is greater than a minimum length between the first and second upper sacrificial patterns.

3. The method of claim 2,
    wherein patterning the upper sacrificial layer comprises forming a third upper sacrificial pattern,
    wherein twice the maximum width of each of the first and second upper spacers is less than a minimum length between the second and third upper sacrificial patterns.

4. The method of claim 1, wherein the first and second upper spacers are connected to each other between the first and second upper sacrificial patterns.

5. The method of claim 1, further comprising:
    performing a side-cut process to pattern the lower spacers to form a plurality of first segments and a plurality of second segments.

6. The method of claim 5,
    wherein the first segments have a bar shape, and
    wherein the second segments are curved when viewed in plan.

7. The method of claim 6, wherein two of the second segments are connected each other.

8. The method of claim 1, wherein patterning the substrate comprises:
    forming first to sixth active patterns sequentially provided along a first direction on an upper portion of the substrate;
    forming a pair of first inner inactive patterns spaced apart from each other with the second and third active patterns therebetween;

forming a pair of second inner inactive patterns spaced apart from each other with the fourth and fifth active patterns therebetween;

forming a pair of first outer inactive patterns spaced apart from each other with the first to third active patterns and the pair of first inner inactive patterns therebetween; and forming a pair of second outer inactive patterns spaced apart from each other with the fourth to sixth active patterns and the pair of second inner inactive patterns therebetween.

9. The method of claim 8, wherein the pair of first outer inactive patterns are connected to the pair of second outer inactive patterns.

10. The method of claim 9, wherein a maximum length in the first direction of a first outer inactive pattern of the pair of first outer inactive patterns is greater than a sum of a first pitch between the first and second active patterns and a second pitch between the second and third active patterns.

11. The method of claim 10, wherein the maximum length in the first direction of the first outer inactive pattern is less than a sum of the first pitch, the second pitch, and a third pitch between the third and fourth active patterns.

* * * * *